(12) United States Patent
Dehe et al.

(10) Patent No.: US 10,384,934 B2
(45) Date of Patent: Aug. 20, 2019

(54) MEMS DEVICE AND METHOD OF MANUFACTURING A MEMS DEVICE

(71) Applicant: Infineon Technologies AG, Neubiberg (DE)

(72) Inventors: Alfons Dehe, Villingen-Schwenning (DE); Stephan Pindl, Ergoldsbach (DE); Bernhard Knott, Neumarkt (DE); Carsten Ahrens, Pettendorf (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/923,599

(22) Filed: Mar. 16, 2018

(65) Prior Publication Data

US 2018/0201504 A1    Jul. 19, 2018

Related U.S. Application Data

(62) Division of application No. 15/206,836, filed on Jul. 11, 2016, now Pat. No. 9,938,140, which is a division
(Continued)

(51) Int. Cl.
*B81C 1/00* (2006.01)
*H04R 19/00* (2006.01)
(Continued)

(52) U.S. Cl.
CPC ...... *B81C 1/00825* (2013.01); *B81C 1/00873* (2013.01); *H04R 19/005* (2013.01); *H04R 19/04* (2013.01); *H04R 31/00* (2013.01); *B81B 2201/0235* (2013.01); *B81B 2201/0257* (2013.01); *B81B 2201/0264* (2013.01);
(Continued)

(58) Field of Classification Search
CPC ............ B81C 1/00825; B81C 1/00182; B81C 1/00246; H04R 19/005; H04R 19/04; G01P 15/0802; G01P 15/125
USPC .......... 257/415, E29.324, E21.04, 416, E29, 257/E21; 438/694, 52, 14, 53, 51
See application file for complete search history.

(56) References Cited

U.S. PATENT DOCUMENTS 7,159,618 B2    1/2007  Broyer et al.
7,834,409 B2   11/2010  Reichenbach et al.
(Continued)

FOREIGN PATENT DOCUMENTS

CN    101616863 A   12/2009
CN    102530847 A    7/2012
(Continued)

OTHER PUBLICATIONS

"SU-8 Photoresist," Wikipedia, http://en.wikipedia.org/wiki/SU-8, downloaded on Oct. 10, 2012, 2 pages.

*Primary Examiner* — Mouloucoulaye Inoussa
(74) *Attorney, Agent, or Firm* — Slater Matsil, LLP

(57) ABSTRACT

A method for manufacturing a MEMS device is disclosed. Moreover a MEMS device and a module including a MEMS device are disclosed. An embodiment includes a method for manufacturing MEMS devices includes forming a MEMS stack over a first main surface of a substrate, forming a polymer layer over a second main surface of the substrate and forming a first opening in the polymer layer and the substrate such that the first opening abuts the MEMS stack.

17 Claims, 31 Drawing Sheets

Related U.S. Application Data of application No. 13/651,372, filed on Oct. 12, 2012, now Pat. No. 9,402,138.

(51) Int. Cl.
    *H04R 19/04*     (2006.01)
    *H04R 31/00*     (2006.01)

(52) U.S. Cl.
    CPC .. *B81C 2201/017* (2013.01); *B81C 2201/053* (2013.01); *H04R 2201/003* (2013.01)

(56) References Cited

U.S. PATENT DOCUMENTS

| | | | |
|---|---|---|---|
| 7,952,185 | B2 | 5/2011 | Theuss et al. |
| 2002/0193036 | A1 | 12/2002 | Benning et al. |
| 2004/0097004 | A1 | 5/2004 | Pogge et al. |
| 2004/0146810 | A1 | 7/2004 | Gabriel et al. |
| 2005/0095814 | A1* | 5/2005 | Zhu ............... H04R 19/005 438/459 |
| 2007/0284682 | A1 | 12/2007 | Laming et al. |
| 2008/0006092 | A1 | 1/2008 | Brida et al. |
| 2008/0038922 | A1 | 2/2008 | Lamers et al. |
| 2008/0261145 | A1 | 10/2008 | Zhong et al. |
| 2009/0311819 | A1 | 12/2009 | Chang et al. |
| 2010/0149266 | A1 | 6/2010 | McAvoy et al. |
| 2011/0104844 | A1* | 5/2011 | Hsieh ............... B81C 1/00246 438/50 |
| 2011/0121412 | A1 | 5/2011 | Quevy et al. |
| 2011/0133297 | A1 | 6/2011 | Franosch et al. |
| 2011/0198970 | A1 | 8/2011 | Martin et al. |
| 2012/0013020 | A1 | 1/2012 | Guo et al. |
| 2012/0025337 | A1 | 2/2012 | Leclair et al. |
| 2013/0264662 | A1 | 10/2013 | Baldo et al. |

FOREIGN PATENT DOCUMENTS

| | | |
|---|---|---|
| DE | 10056716 A1 | 5/2002 |
| DE | 102005004877 A1 | 8/2006 |
| DE | 102006005994 A1 | 8/2007 |
| DE | 602004002407 T2 | 9/2007 |
| DE | 102006058010 A1 | 6/2008 |
| DE | 102008003452 A1 | 7/2009 |

\* cited by examiner

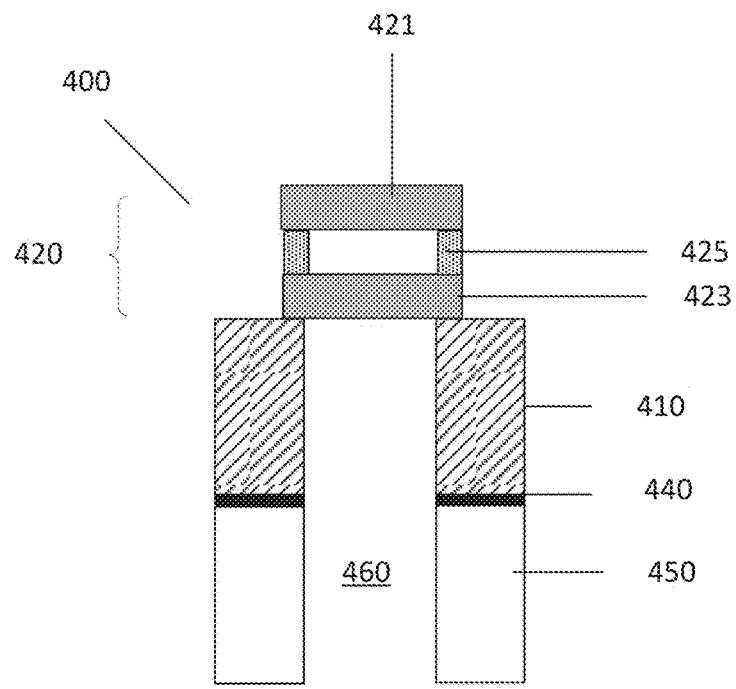
*FIG. 4a*
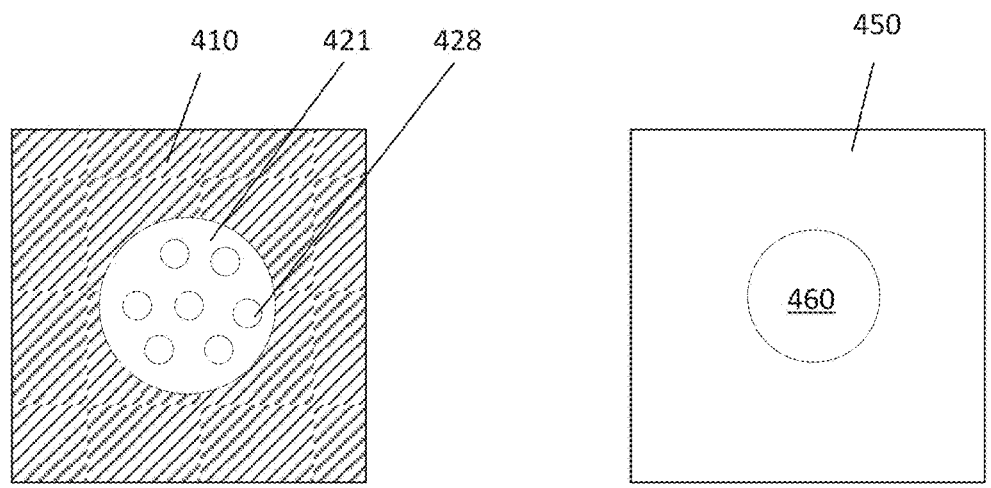
*FIG. 4b*     *FIG. 4c*

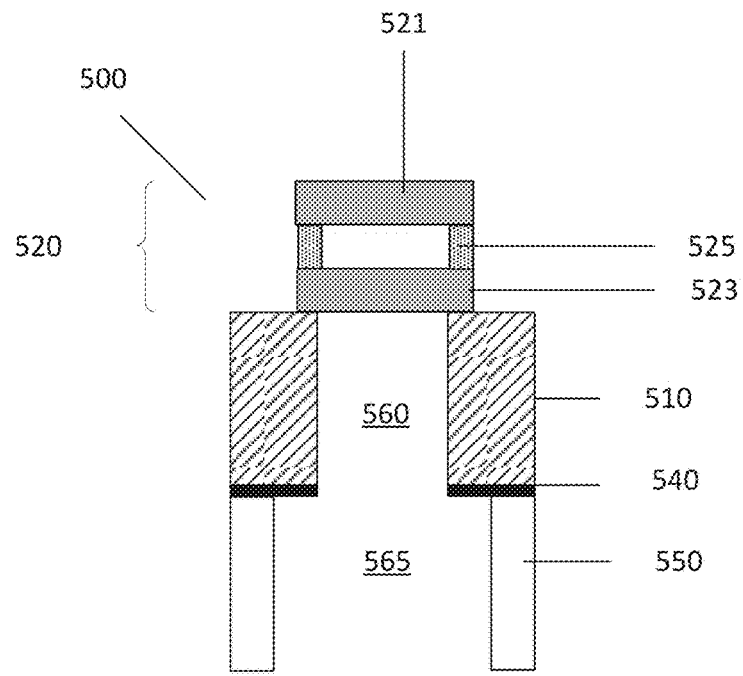
*FIG. 5a*
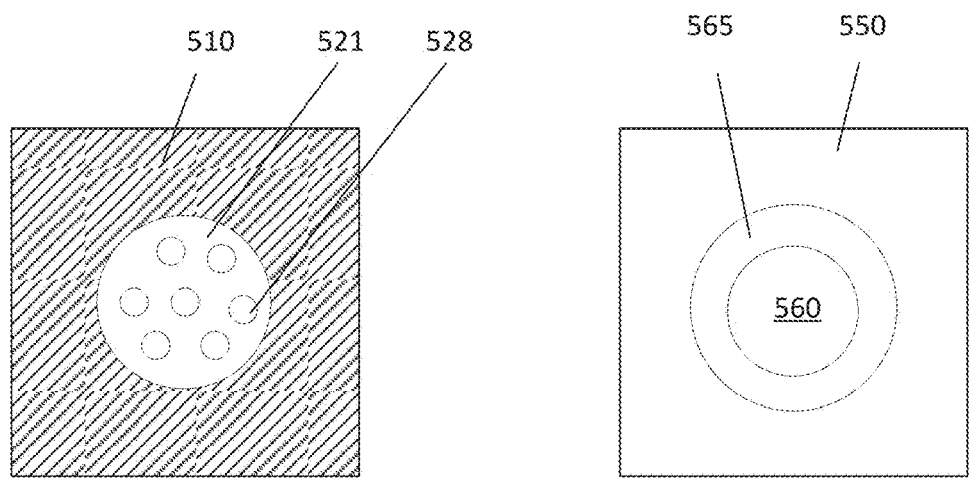
*FIG. 5b*  *FIG. 5c*

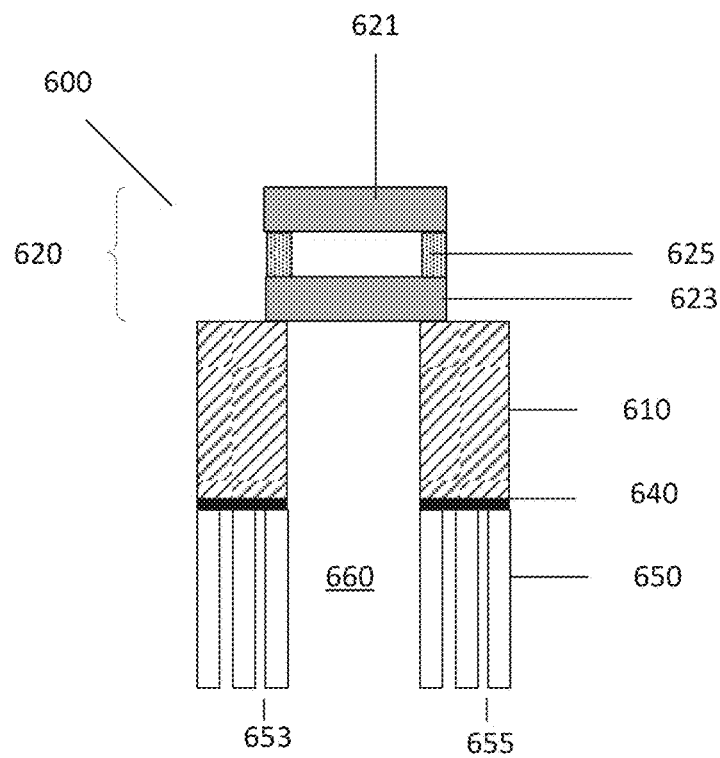
FIG. 6a
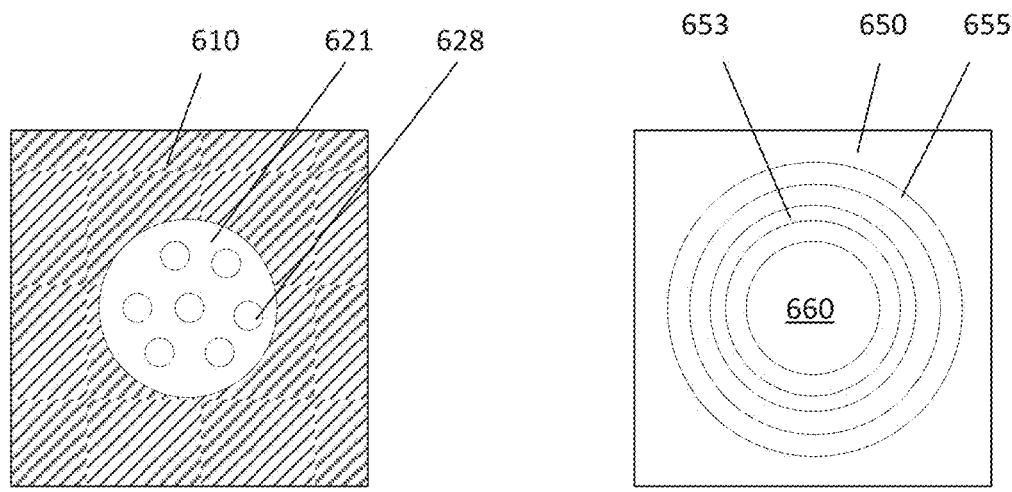
FIG. 6b  FIG. 6c

MEMS DEVICE AND METHOD OF MANUFACTURING A MEMS DEVICE

CROSS-REFERENCE TO RELATED APPLICATIONS

This application is a Divisional Application of U.S. application Ser. No. 15/206,836, filed on Jul. 11, 2016, which is a divisional of U.S. application Ser. No. 13/651,372, filed on Oct. 12, 2012, now issued as U.S. Pat. No. 9,402,138 which applications are hereby incorporated herein by reference.

TECHNICAL FIELD

The present invention relates generally to a system and a method for manufacturing a micro-electromechanical system (MEMS) device.

BACKGROUND

Over the past years a desire for smaller electronic form factors and power consumption along with increased performance has driven an integration of MEMS devices. In particular, MEMS microphones may become smaller and smaller because electronic devices such as, e.g., cell phones, laptops, and tablets become smaller and smaller.

A feature in the performance of a MEMS microphone is the size of the MEMS device itself and the stress in the MEMS microphone generated during the manufacturing process.

SUMMARY

In accordance with an embodiment of the present invention, a method for manufacturing MEMS devices comprises forming a MEMS stack on a first main surface of a substrate, forming a polymer layer on a second main surface of the substrate and forming a first opening in the polymer layer and the substrate such that the first opening abuts the MEMS stack.

In accordance with another embodiment of the present invention, a MEMS device comprises a polymer layer, a substrate disposed on the polymer layer and a MEMS stack disposed on the substrate. The MEMS device further comprises a first opening disposed in the polymer layer and a second opening disposed in the substrate such that the second opening abuts the MEMS stack and the first opening.

In accordance with yet another embodiment of the present invention, a module comprises a MEMS device carrier, a MEMS device, and an adhesive connecting the MEMS device carrier and the MEMS device. The MEMS device comprises a photoresist layer, a substrate disposed on the photoresist layer the substrate having a front side and a back side, a MEMS stack disposed on the front side of the substrate and an opening connecting the MEMS stack from a backside of the substrate.

BRIEF DESCRIPTION OF THE DRAWINGS

For a more complete understanding of the present invention, and the advantages thereof, reference is now made to the following descriptions taken in conjunction with the accompanying drawings, in which:

FIGS. 4a-4c show an embodiment of a MEMS device;

FIGS. 5a-5c show another embodiment of a MEMS device; and

FIGS. 6a-6d show yet another embodiment of a MEMS device.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a silicon microphone manufacturing process. Embodiments of the invention may also be applied, however, to other microphone manufacturing processes or other MEMS manufacturing processes.

Silicon microphone wafers are typically processed on the front side to form the membrane and the backplate, and from the backside to form the back-cavity. The formation of the back-cavity requires a dry etch step which is slow in time, imprecise and expensive. Conventional wafers comprise a thickness of 400 µm to 675 µm.

In one embodiment the MEMS manufacturing process comprises a thin MEMS wafer or substrate. In one embodiment a polymer layer is disposed on the thin MEMS wafer or substrate. In one embodiment a negative or positive photoresist layer is disposed on the thin MEMS wafer or substrate. The negative or positive photoresist is structured and openings are formed in the negative or positive photoresist and in the substrate of the thin MEMS wafer. In one embodiment a MEMS device comprise a polymer layer, a negative photoresist or a positive photoresist layer.

An advantage is that the thin MEMS device or MEMS wafer is stabilized by the polymer, the negative photoresist layer or positive photoresist layer. A further advantage is that the mechanical stress in the thin MEMS device is reduced when placed on a device carrier.

Figure 1A:
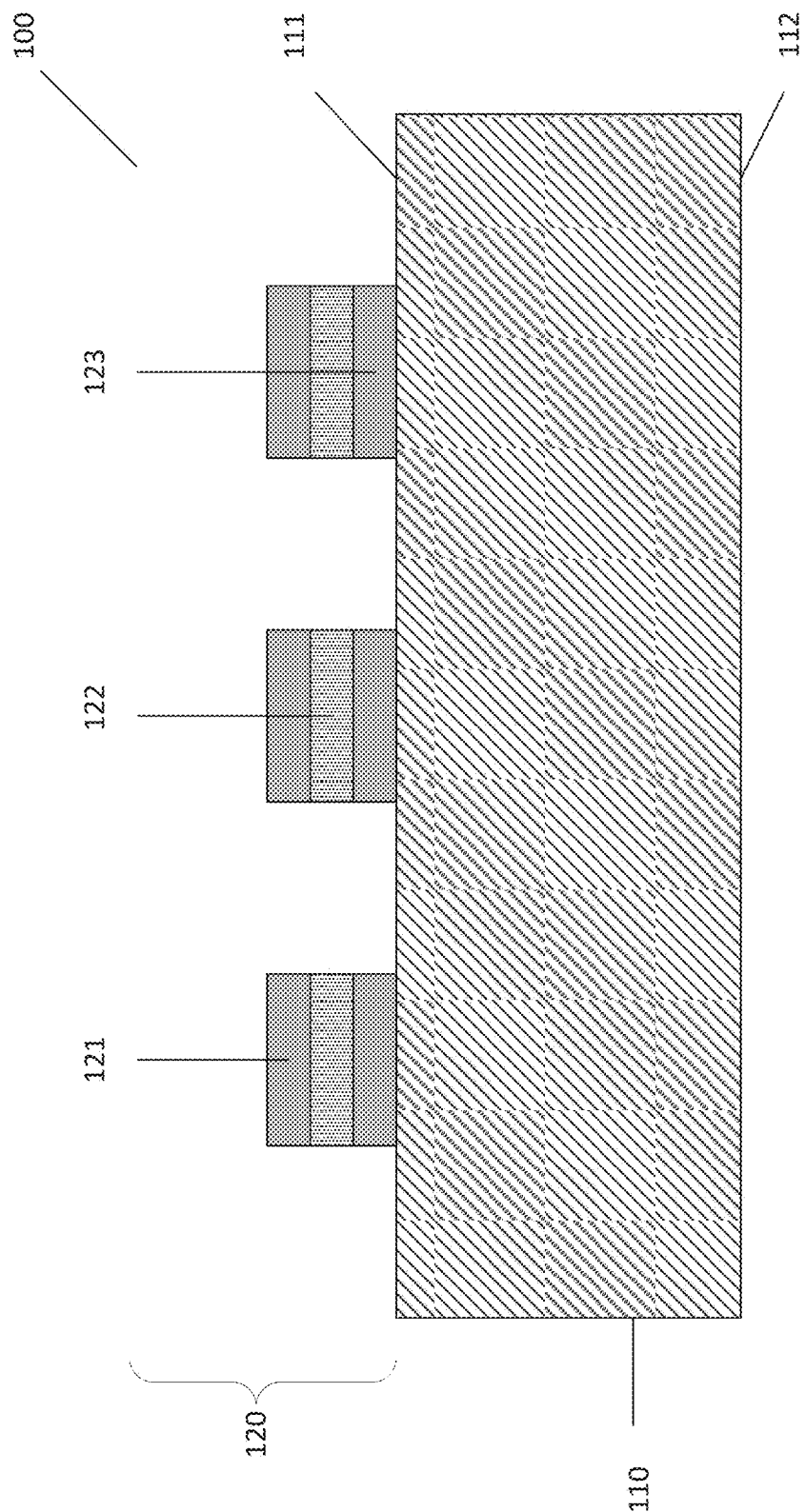
FIGS. 1a-1i show an embodiment of a method to manufacture a MEMS device.

FIGS. 1a-1i illustrate an embodiment of a method to manufacture a MEMS device. FIG. 1a shows a MEMS wafer 100 comprising a substrate 110 with MEMS stacks 120 disposed thereon. The substrate 110 comprises a first main surface or front side 111 and a second main surface or backside 112. The MEMS stacks 120 comprise a membrane 121 as a top layer of the layer stack, a backplate 123 and a sacrificial layer 122 between the membrane 121 and the backplate 123. Alternatively, the MEMS stacks 120 comprise a backplate 123 as a top layer of the layer stack and a membrane 121 close to the substrate 110. The MEMS devices 105 may be MEMS microphones or silicon microphones.

In one embodiment the MEMS devices 105 may comprise transducers. The transducers may be sensor such as pressure sensors, accelerometers, or RF MEMS. The MEMS devices 105 may be stand-alone devices or alternatively may comprise additional devices. For example, the MEMS devices 105 may comprise integrated circuits (ICs) or pre-amplifiers and input/output terminals.

The substrate 110 may comprise a semiconductive material such as silicon or germanium, a compound semiconductor such as SiGe, GaAs, InP, GaN or SiC. Alternatively, the substrate 110 may comprise organic materials such as glass or ceramic. The MEMS wafer 100 may comprise a standard thickness of 400 µm to 700 µm. FIG. 1a may show the MEMS wafer 100 after the front side processing has been finished.

Figure 1B:
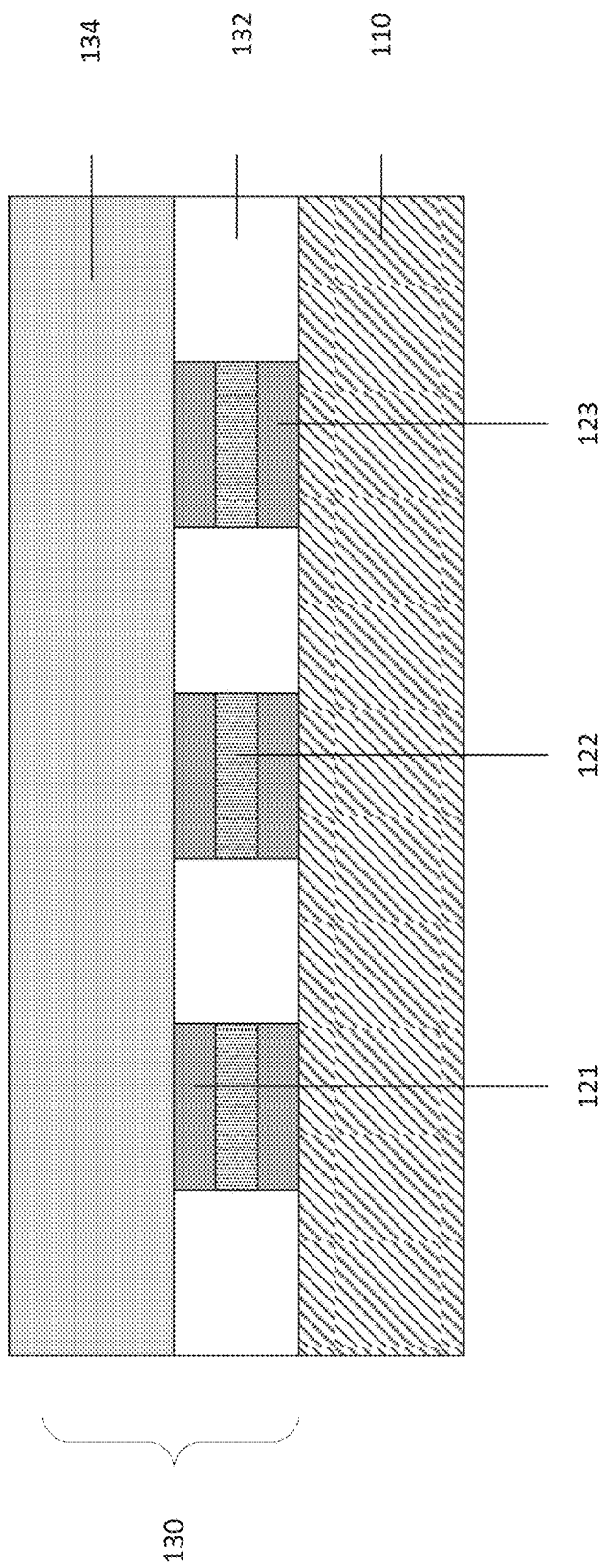

The MEMS wafer 100 is placed or mounted on a support carrier 130. The MEMS wafer 100 may be placed with its top surface 111 on the support carrier 130. The support carrier 130 may protect the MEMS stacks 120. The support carrier 130 may comprise a support substrate 134 and an adhesive layer 132. The adhesive layer 132 moves into and fills the gaps between the MEMS stacks 120. The support substrate 134 may be glass or an UV tape and the adhesive layer 132 may be a wax or an otherwise adhesive material. As shown in FIG. 1b the substrate 110 of the MEMS wafer 100 is then thinned to a thickness of about 100 µm to about 200 µm or to a thickness of about 50 µm to about 200 µm. Thinning the substrate 110 may be an optional step. Thinning the substrate 110 may be carried out with an abrasive device or abrasive film.

In a next step the MEMS wafer 100 is flipped and a polymer film 140 is disposed on the second main surface 112 of the substrate 110. The polymer film 140 may be a photo structurable polymer film. In one embodiment the polymer film 140 may be an epoxy based negative photoresist. For example, the polymer film 140 may be SU-8 resist. The SU-8 resist comprises a chemically amplified, epoxy based negative resist that is optically transparent and photo imageable to near UV (365 nm) radiation. Cured SU-8 resist films or microstructures are very resistant to solvents, acids and bases and have excellent thermal and mechanical stability. Alternatively, the polymer film 140 may be a positive photoresist. The polymer film 140 may be deposited or spun on the backside 112 of the substrate 110. The polymer film 140 may comprise a thickness of about 100 µm to about 200 µm or to a thickness of about 50 µm to about 300 µm.

Figure 1C:
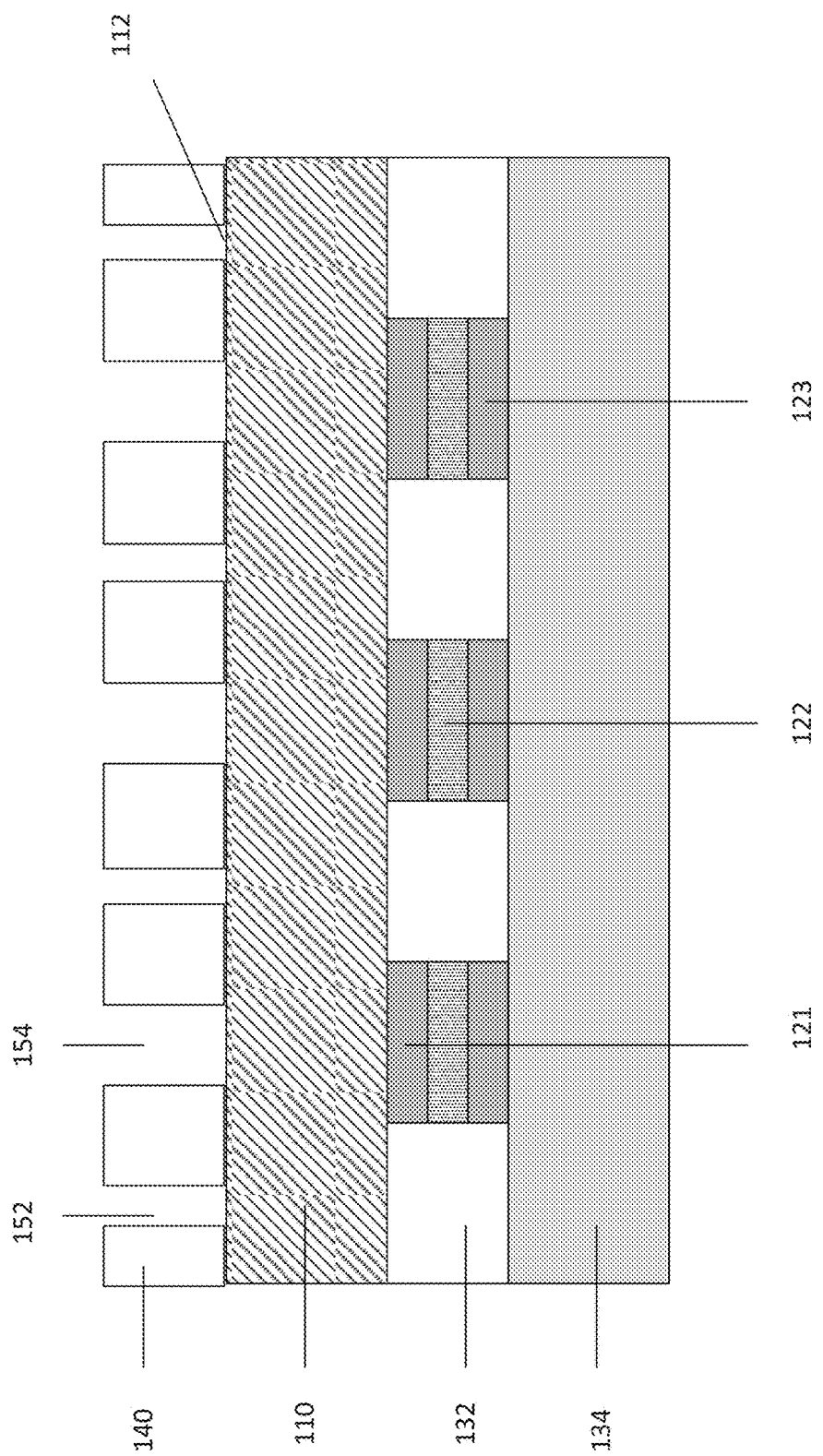

The polymer film 140 is structured and openings 152, 154 are formed. The openings 152 are the pattern for cutting the substrate 110 in separate individual pieces and the openings 154 are the pattern for the MEMS stack 105 opening. The MEMS stack openings may be a back-cavity or alternatively, a sound port of a MEMS device 105. This is shown in FIG. 1c.

Figure 1D:
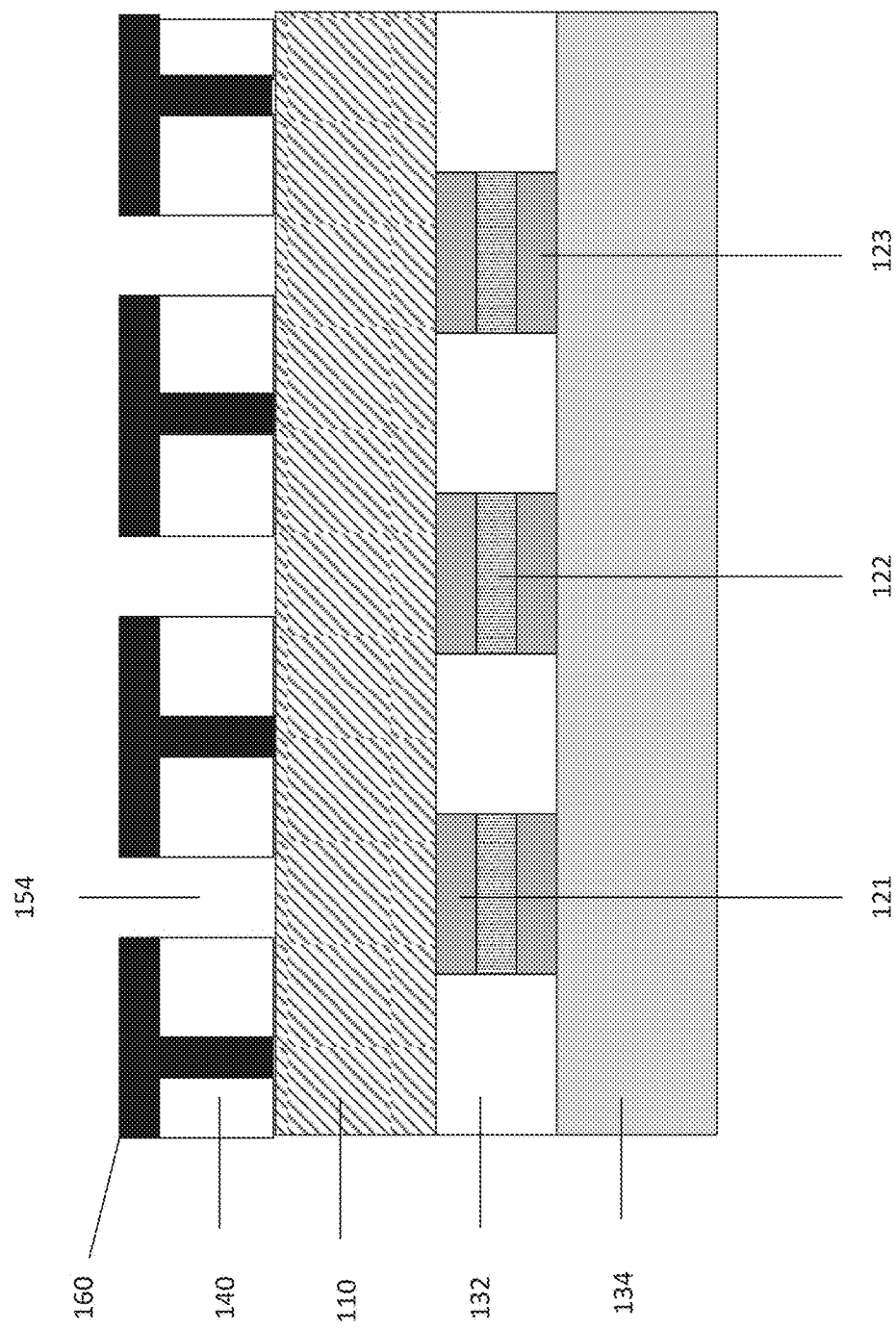
Figure 1E:
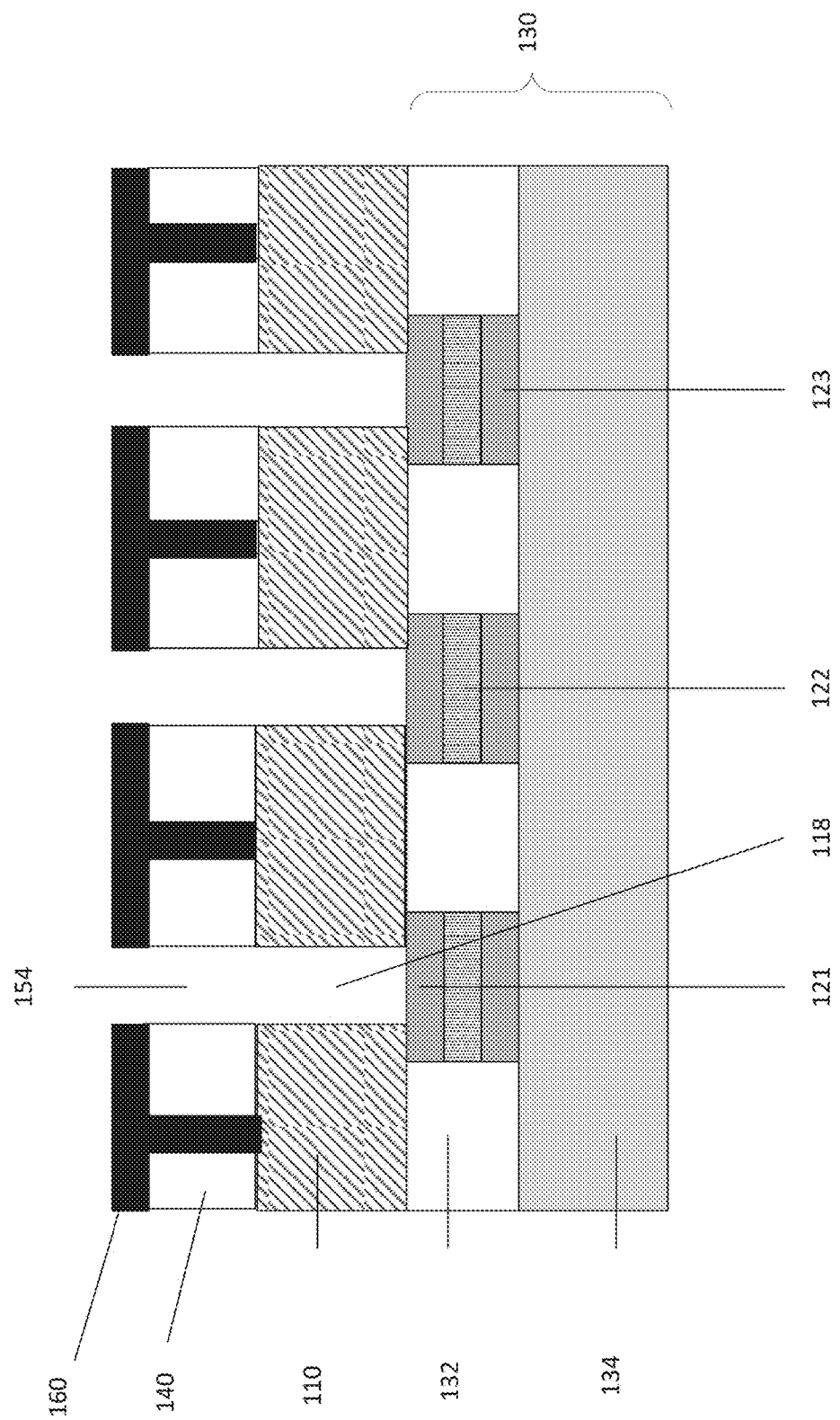

In the next step shown in FIG. 1d, the polymer film 140 is masked with a masking layer 160. The masking layer 160 may comprise a photo resist. The photo resist may be a different photo resist than the polymer film 140. The masking layer 160 overlies the top surface of the polymer film 140 and fills the openings 152. The masking layer 160 does not fill the openings 154. The substrate 110 is then etched. The substrate 110 may be etched applying a directional or anisotropic etch. The substrate 110 may be etched with a dry etch or a wet etch. For example, the substrate 110 may be etched with a deep RIE. Openings 118 are formed in the substrate 110. This is shown in FIG. 1e.

Figure 1F:
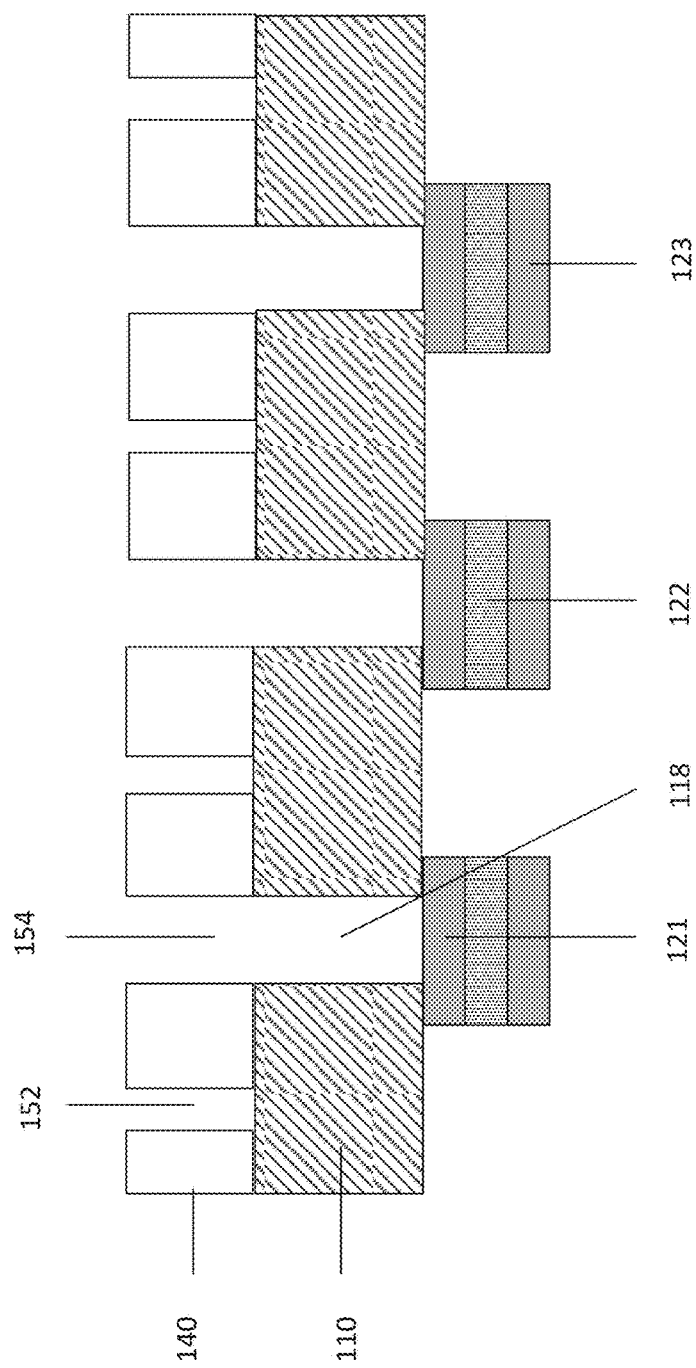

The masking layer 160 is then removed from the polymer film 140. For example the masking layer 160 is dissolved with a stripper solvent. Alternatively, the masking layer 160 is removed with other material. Moreover, the support carrier 130 (e.g., the substrate 134 and the adhesive layer 132) is removed from the substrate 110. The support carrier 130 is removed by pulling or detaching the support carrier 130 from the substrate 110. The resulting structure is shown in FIG. 1f.

Figure 1G:
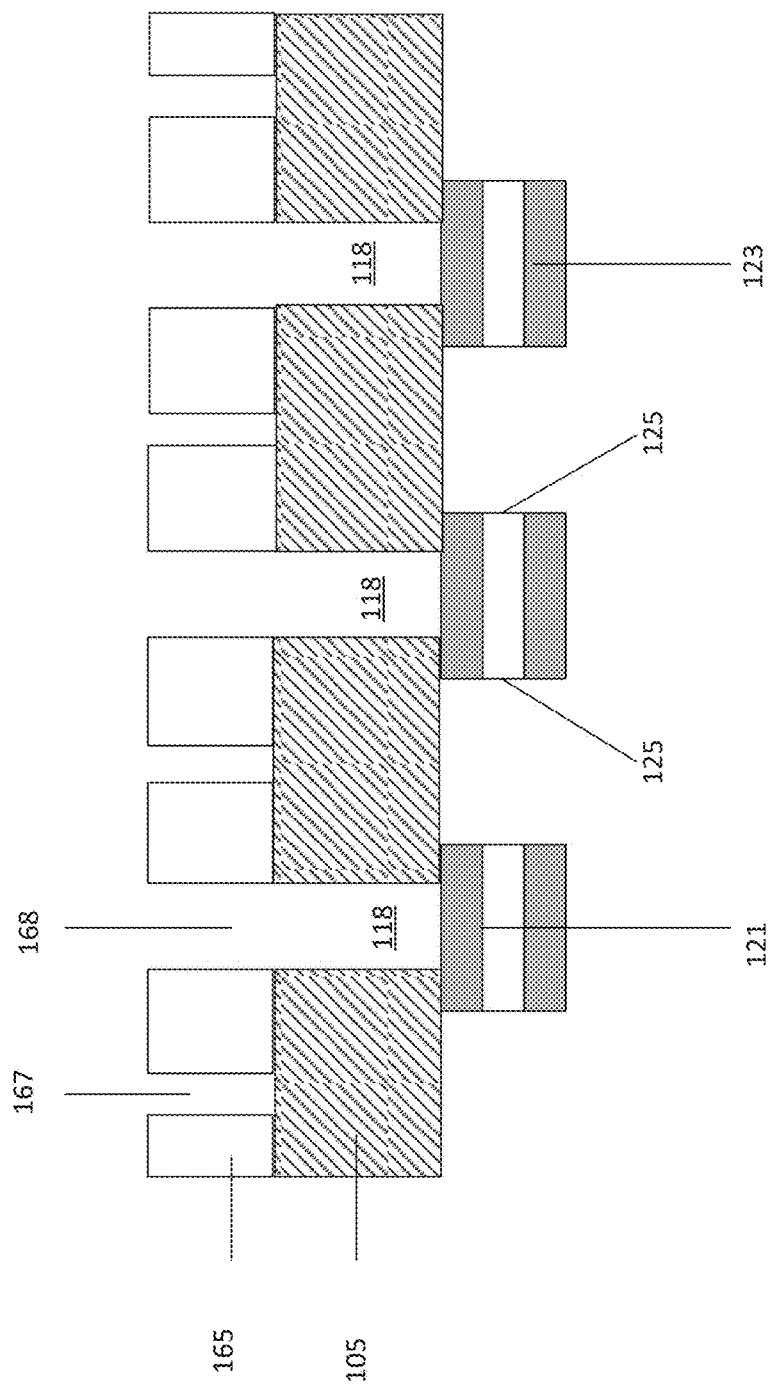

In the next step, shown in FIG. 1g, the sacrificial layer 122 is removed and the membrane 121 is released. The membrane 121 is released by a wet etching process. For example, the membrane 121 is released by a vapor or gas phase etching with HF based etches in case the sacrificial layer 122 is an oxide sacrificial layer. The sacrificial layer 122 is removed such that spacers 125 remain between the membrane 121 and the backplate 123. The spacers 123 provide the support for the membrane 121 and the backplate 123.

Figure 1H:
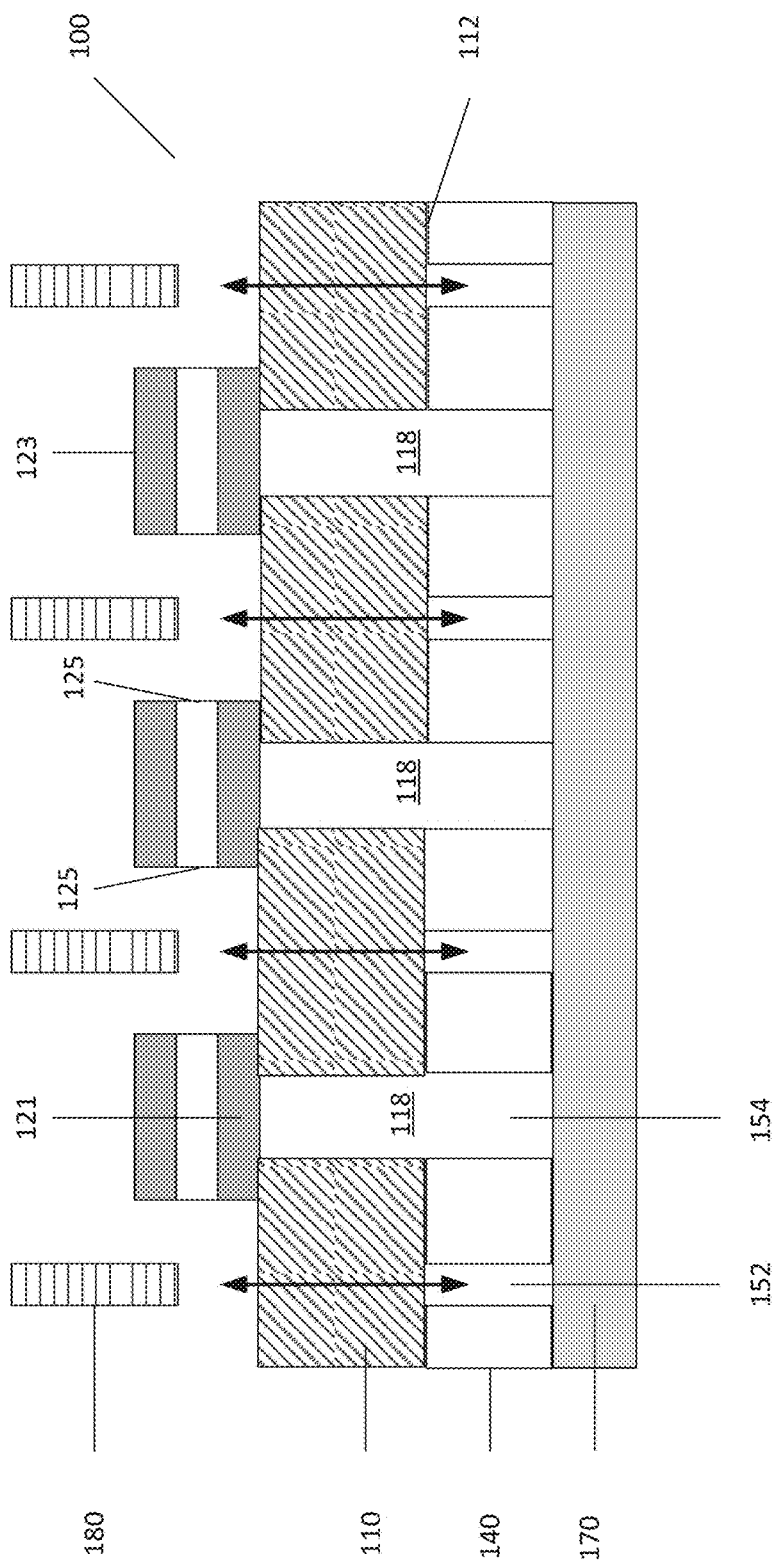

The wafer 100 is then flipped again and placed or put on a dicing support 170 such that the second main surface 112 of the substrate 110 faces the dicing support 170. The dicing support may be a dicing foil. The substrate 110 is then cut with a cutting device 180 through the dicing slots 152 forming cutting lines in the substrate 110. In one embodiment the cutting device 180 is a laser. The laser may melt the substrate 110 when cutting through the substrate. The laser 180 may weaken the structure of the substrate 110 (but not separate it) or may cut and separate the substrate 110. Alternatively, the cutting device 180 is a wafer saw. The wafer saw cut and separate the wafer in several pieces. This is shown in FIG. 1h.

Figure 1I:
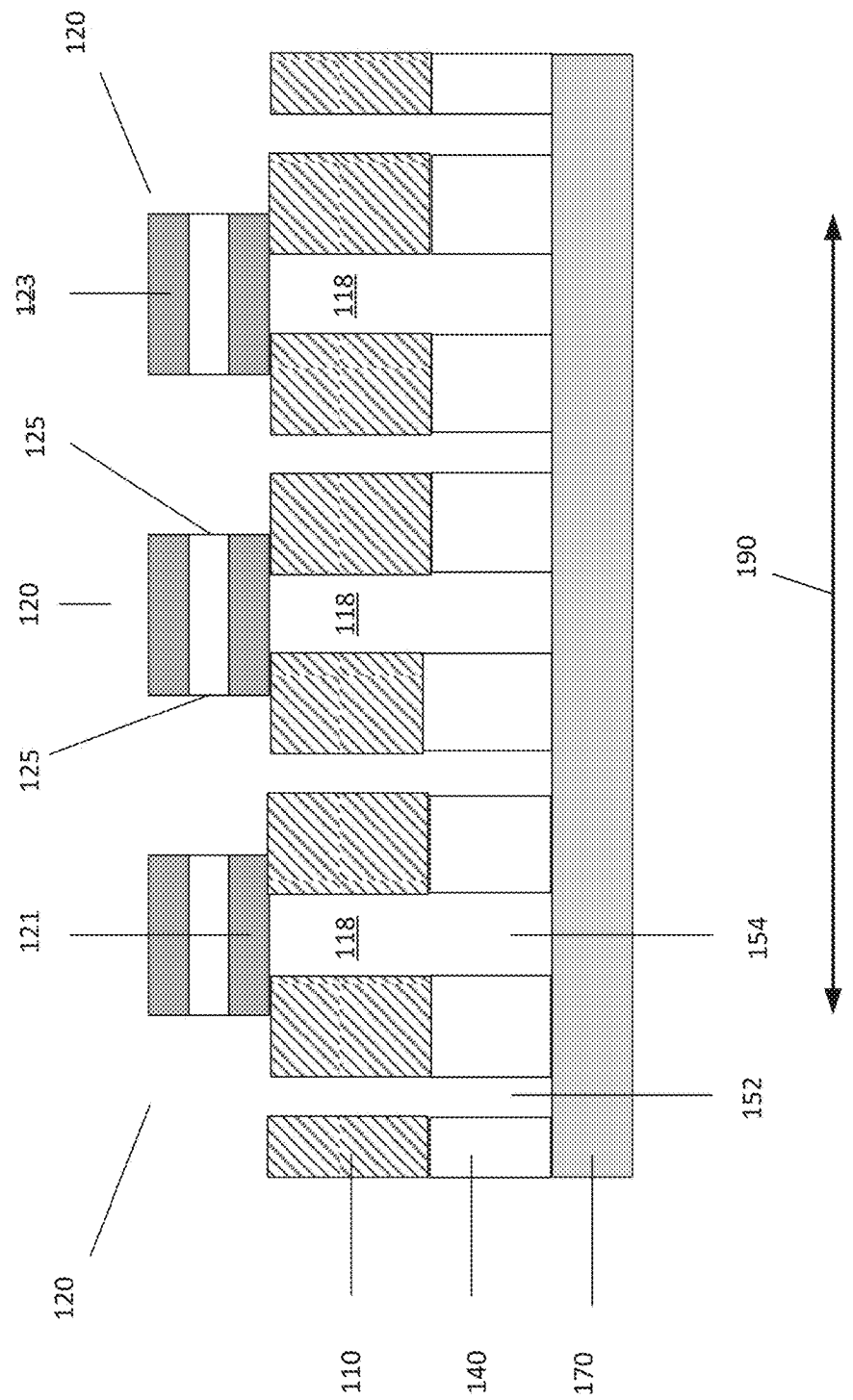

Finally, as shown in FIG. 1i, the dicing foil 170 may be stretched in a horizontal direction 190 so that the individual MEMS devices 120 can be picked up. In one embodiment, the stretching 190 of the dicing foil 170 may break and separate the individual MEMS devices 120 from each other. Alternatively the stretching 190 of the dicing foil 170 may increase the space between the MEMS devices 120.

Figure 2A:
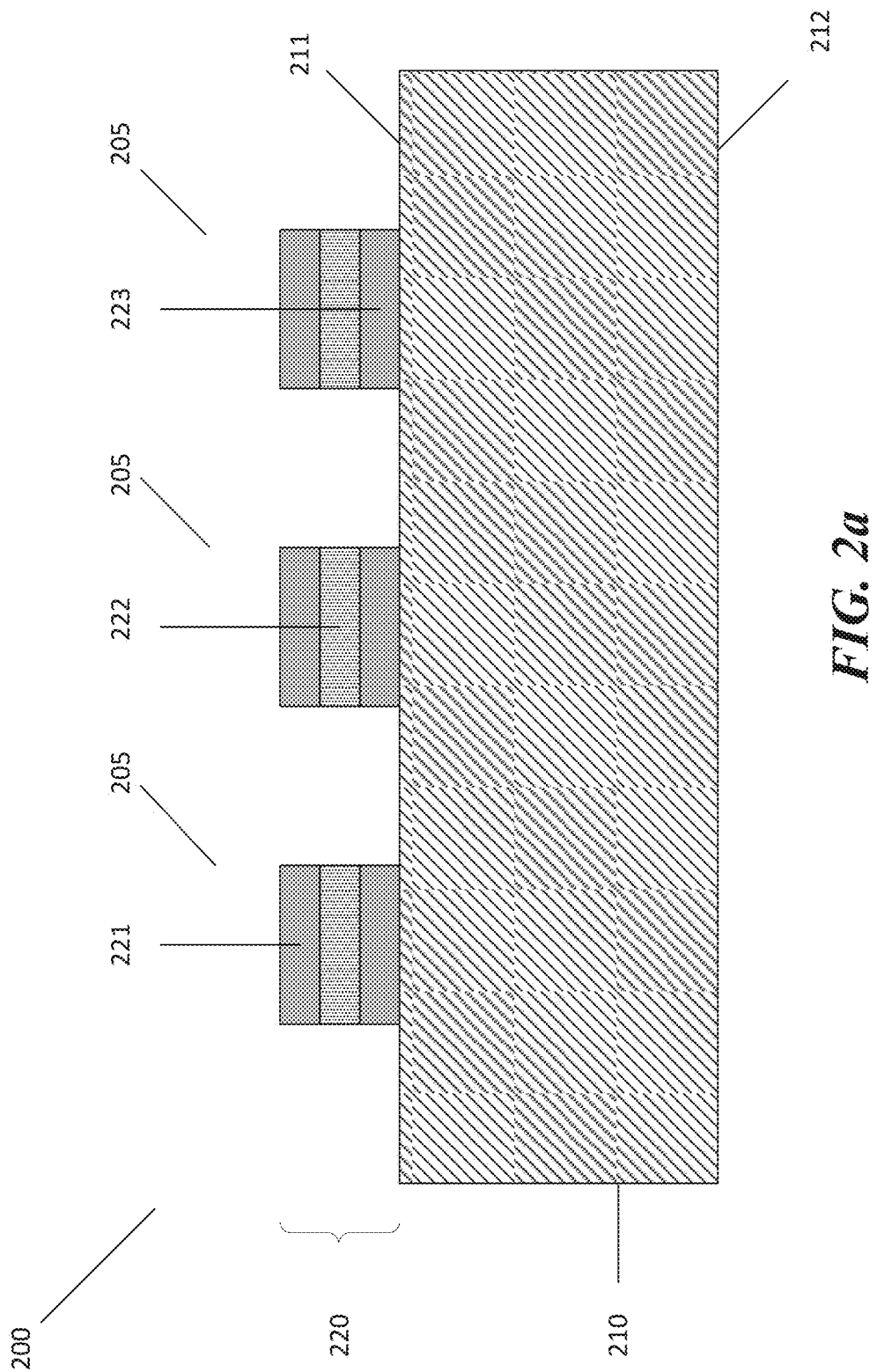
FIGS. 2a-2j show a further embodiment of a method to manufacture a MEMS device.

FIGS. 2a-2j illustrate another embodiment of a method to manufacture a MEMS device. FIG. 2a shows a MEMS wafer 200 comprising a substrate 210 with MEMS stacks 220 disposed thereon. The substrate 210 comprises a first main surface or front side 211 and a second main surface or backside 212. The MEMS stacks 220 comprise a membrane 221 as a top layer of the MEMS device layer stack, a backplate 223 and a sacrificial layer 222 between the membrane 221 and the backplate 223. Alternatively, the MEMS stacks 220 comprise a backplate 223 as a top layer of the layer stack and a membrane 221 close to the substrate 210. A MEMS stack 220 and a portion of the MEMS wafer form a MEMS device 205. The MEMS device 205 may comprise a MEMS microphone or a silicon microphone.

In one embodiment the MEMS device 205 may comprise a transducer. The transducer may be a sensor such as a pressure sensor, an accelerometer, or a RF MEMS. The MEMS device 205 may be stand-alone device or alternatively may comprise an additional device. For example, the MEMS device 205 may comprise an integrated circuit (ICs) or a pre-amplifier and input/output terminals.

The substrate 210 may comprise a semiconductive material such as silicon or germanium, a compound semiconductor such as SiGe, GaAs, InP, GaN or SiC. Alternatively, the substrate 210 may comprise organic materials such as glass or ceramic. The MEMS wafer 200 may comprise a standard thickness of 400 µm to 700 µm. FIG. 2a may show the MEMS wafer 200 after the front side processing has been finished.

Figure 2B:
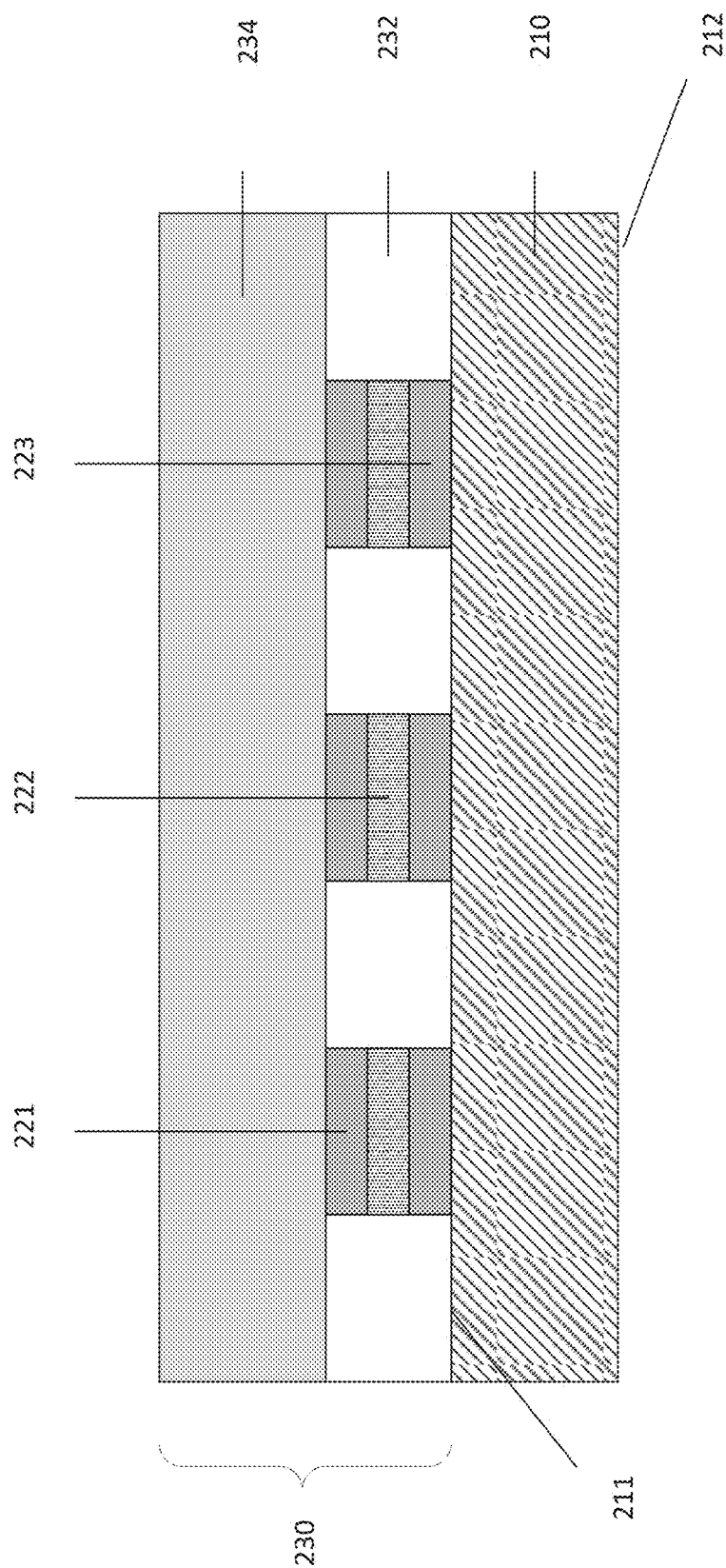

The MEMS wafer 200 is placed or mounted on a support carrier 230. The MEMS wafer 200 may be placed with its top surface 211 on the support carrier 230. The support carrier 230 may protect the MEMS stacks 220. The support carrier 230 may comprise a support substrate 234 and an adhesive layer 232. The adhesive layer 232 moves into and fills the gaps between the MEMS stacks 220. The support substrate 234 may be glass or an UV tape and the adhesive layer 232 may be a wax or an otherwise adhesive material. As shown in FIG. 2b the substrate 210 of the MEMS wafer 200 is then thinned to a thickness of about 100 µm to about 200 µm or to a thickness of about 50 µm to about 200 µM. Thinning the substrate 210 may be an optional step. Thinning the substrate 210 may be carried out with an abrasive device or abrasive film.

Figure 2C:
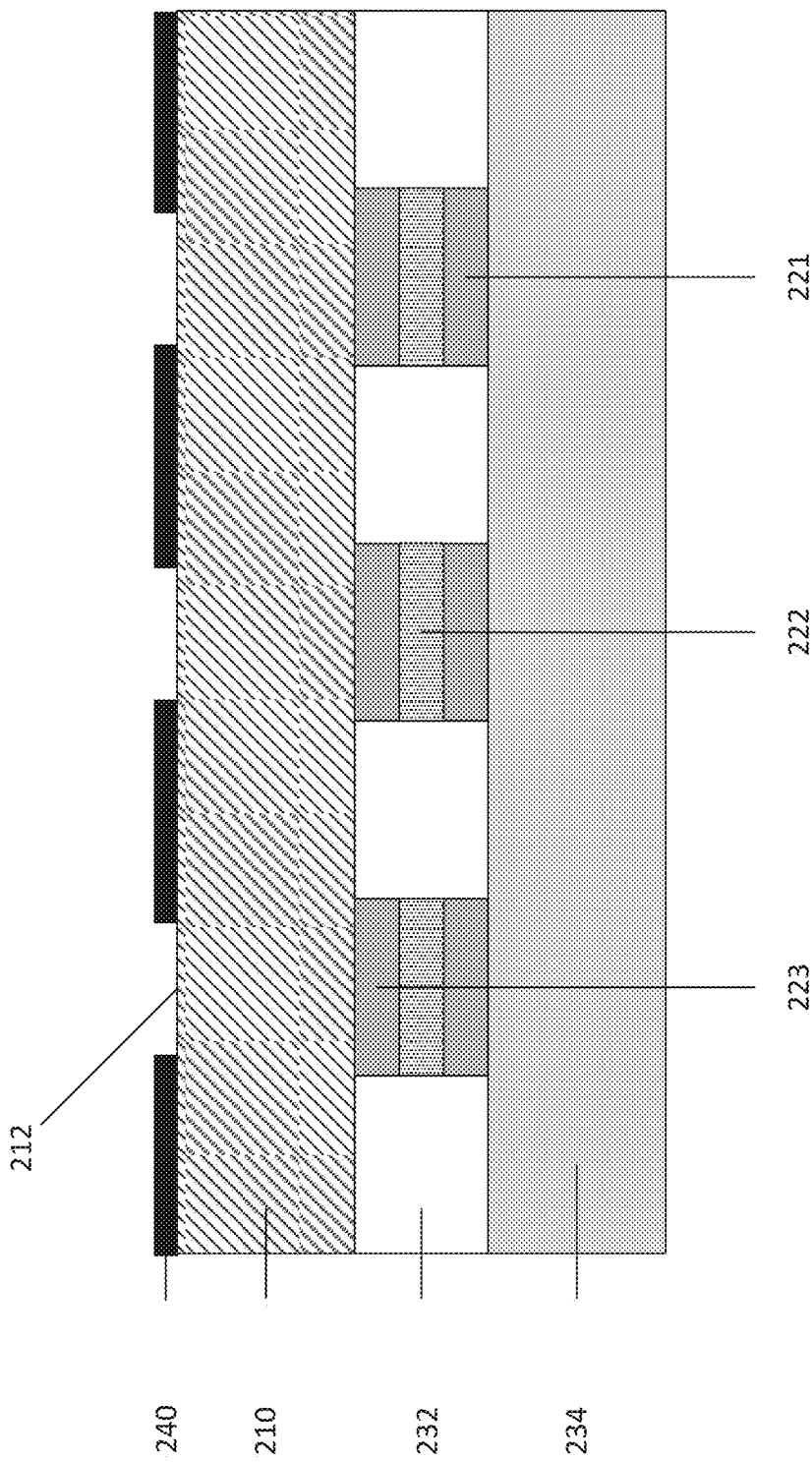

In a next step shown in FIG. 2c, the MEMS wafer 200 is flipped and an etch stop layer 240 is disposed on the second main surface 212 of the substrate 210. The etch stop layer 240 may be a hard mask. The etch-stop layer 240 is patterned or selectively deposited such that the etch stop layer 240 is not disposed on the substrate 210 in at least a central portion of the membrane 221 or backplate 223. The etch stop layer 240 may be disposed on the regions of the substrate 210 which are not vis-à-vis or opposite the membrane 221 or backplate 223. In one embodiment the hard mask is formed by depositing an oxide such as a silicon oxide in a plasma enhanced CVD process.

Figure 2D:
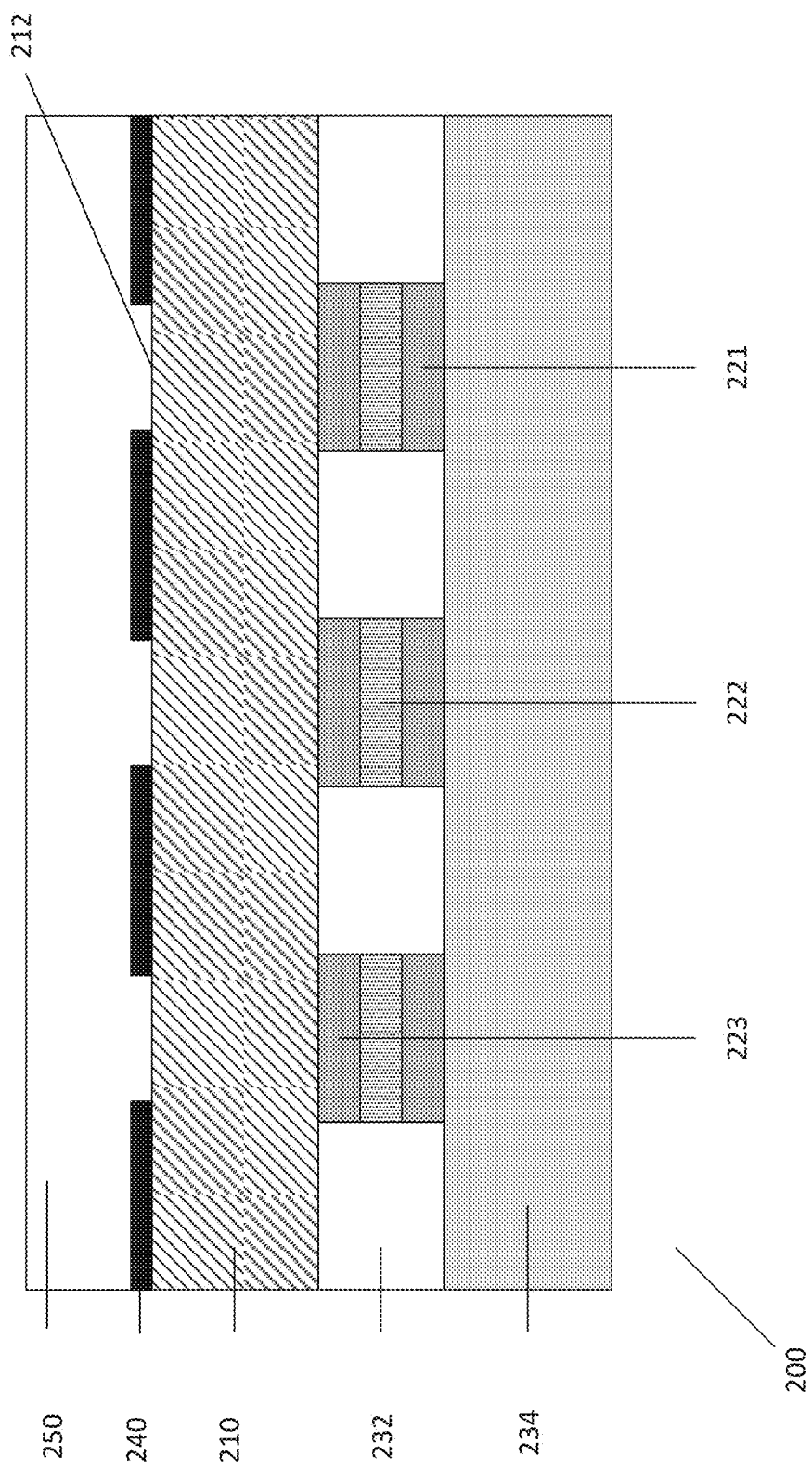

In the step of FIG. 2d a polymer layer 250 is disposed on the second main surface 212 of the MEMS wafer 200. The polymer film 250 may be a photo structurable polymer film. In one embodiment the polymer film 250 may be an epoxy based negative photoresist. For example, the polymer film 250 may be SU-8 resist. The SU-8 resist comprises a chemically amplified, epoxy based negative resist that is optically transparent and photo imageable to near UV (365 nm) radiation. Cured SU-8 resist films or microstructures are very resistant to solvents, acids and bases and have excellent thermal and mechanical stability. Alternatively, the polymer film 250 may be an epoxy based positive photoresist. The polymer film 250 may be deposited or spun on the backside 212 of the substrate 210. The polymer film 250 may comprise a thickness of about 100 µm to about 200 µm or to a thickness of about 50 µm to about 300 µm.

Figure 2E:
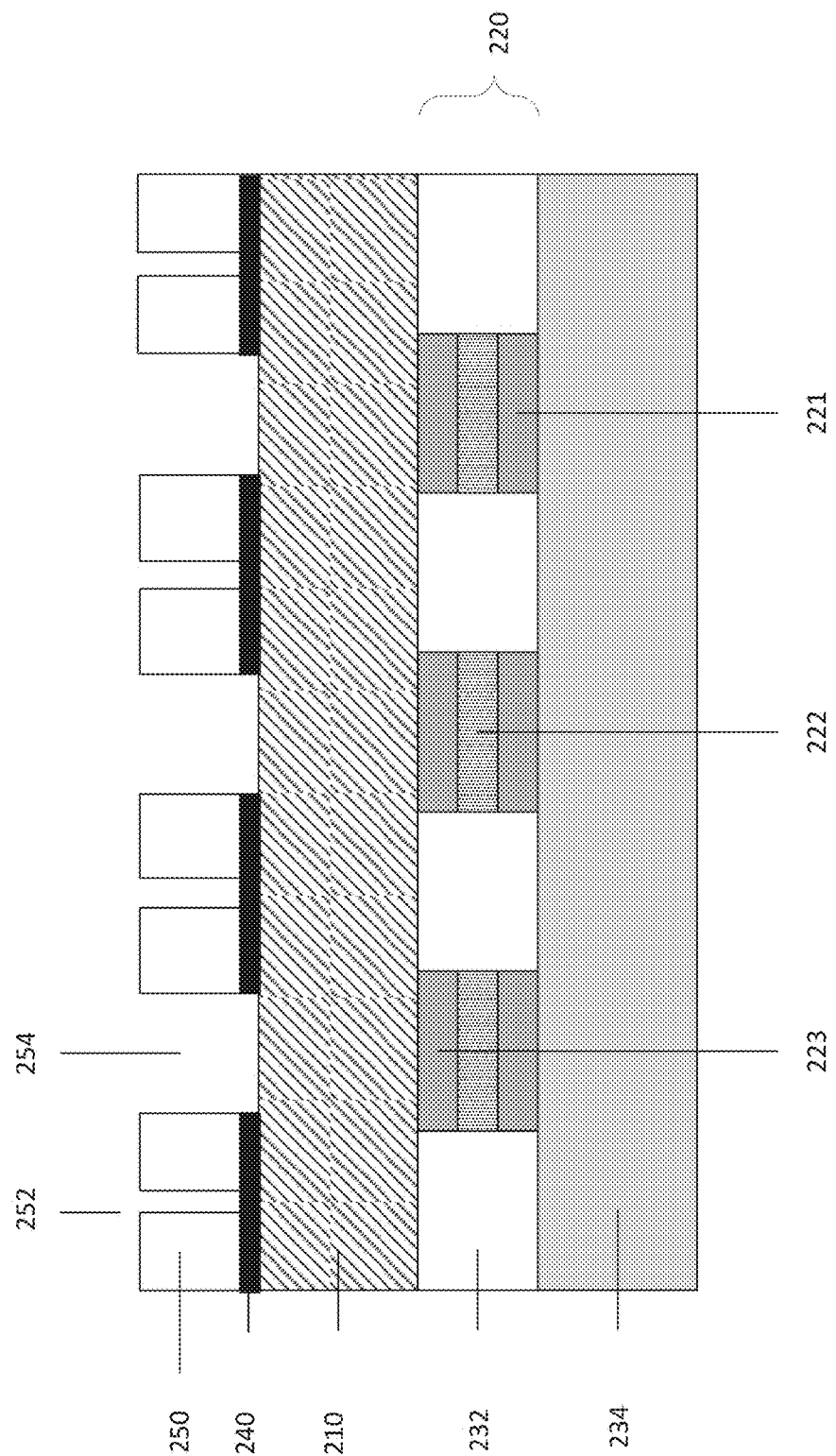

The polymer film 250 is structured and openings 252, 254 are formed. The openings 252 are the pattern for cutting the substrate 210 in separate individual pieces and the openings 254 are the pattern for the MEMS stacks 220 opening. For example, the MEMS stack opening may be a back-cavity or a sound port of the MEMS devices 205. This is shown in FIG. 2e.

Figure 2F:
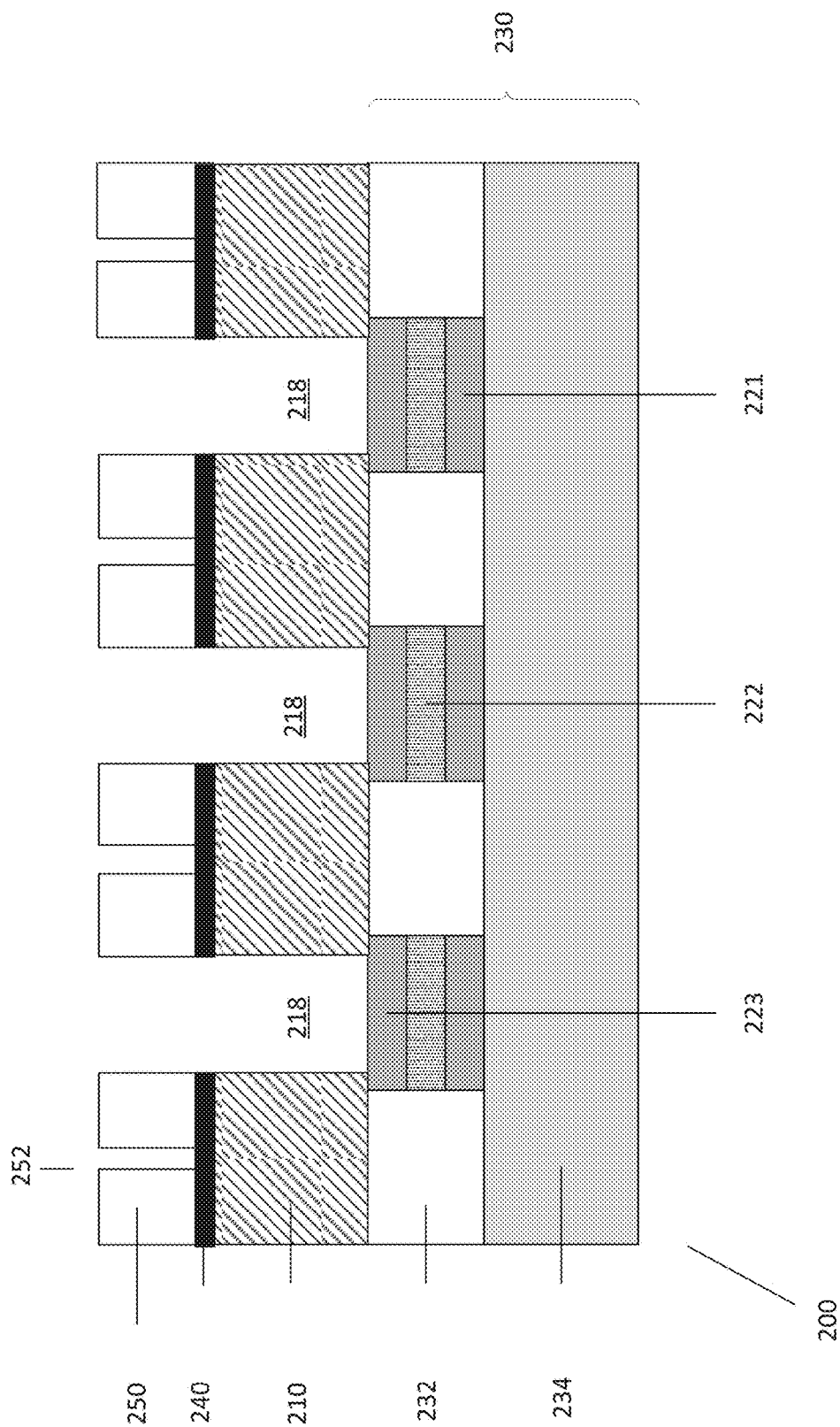

In the next step shown in FIG. 2f, the substrate 210 is etched. The substrate 210 may be etched applying a directional or anisotropic etch. The substrate 210 may be etched with a dry etch or a wet etch. For example, the substrate 210 may be etched with a deep RIE. Openings 218 are formed in the substrate 210. The etch stop layer 240 prevents the substrate 210 to be etched beneath the openings 252. The openings 218 are MEMS stack openings such as a back-cavity.

Figure 2G:
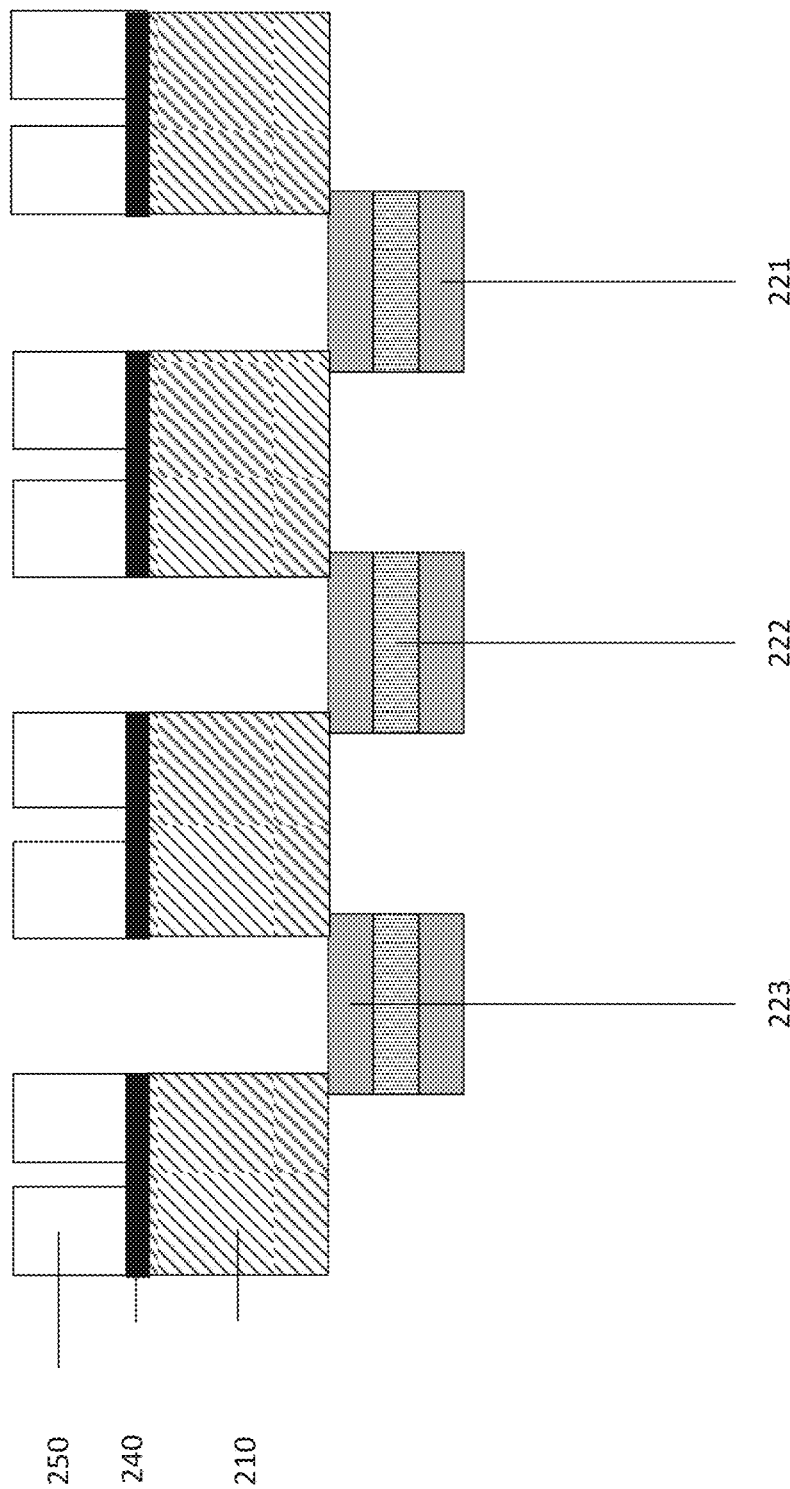

The support carrier 230 (e.g., the substrate 234 and the adhesive layer 232) is removed from the substrate 210. For example, the support carrier 230 is removed by pulling or detaching the support carrier 230 from the substrate 210. The resulting structure is shown in FIG. 2g.

Figure 2H:
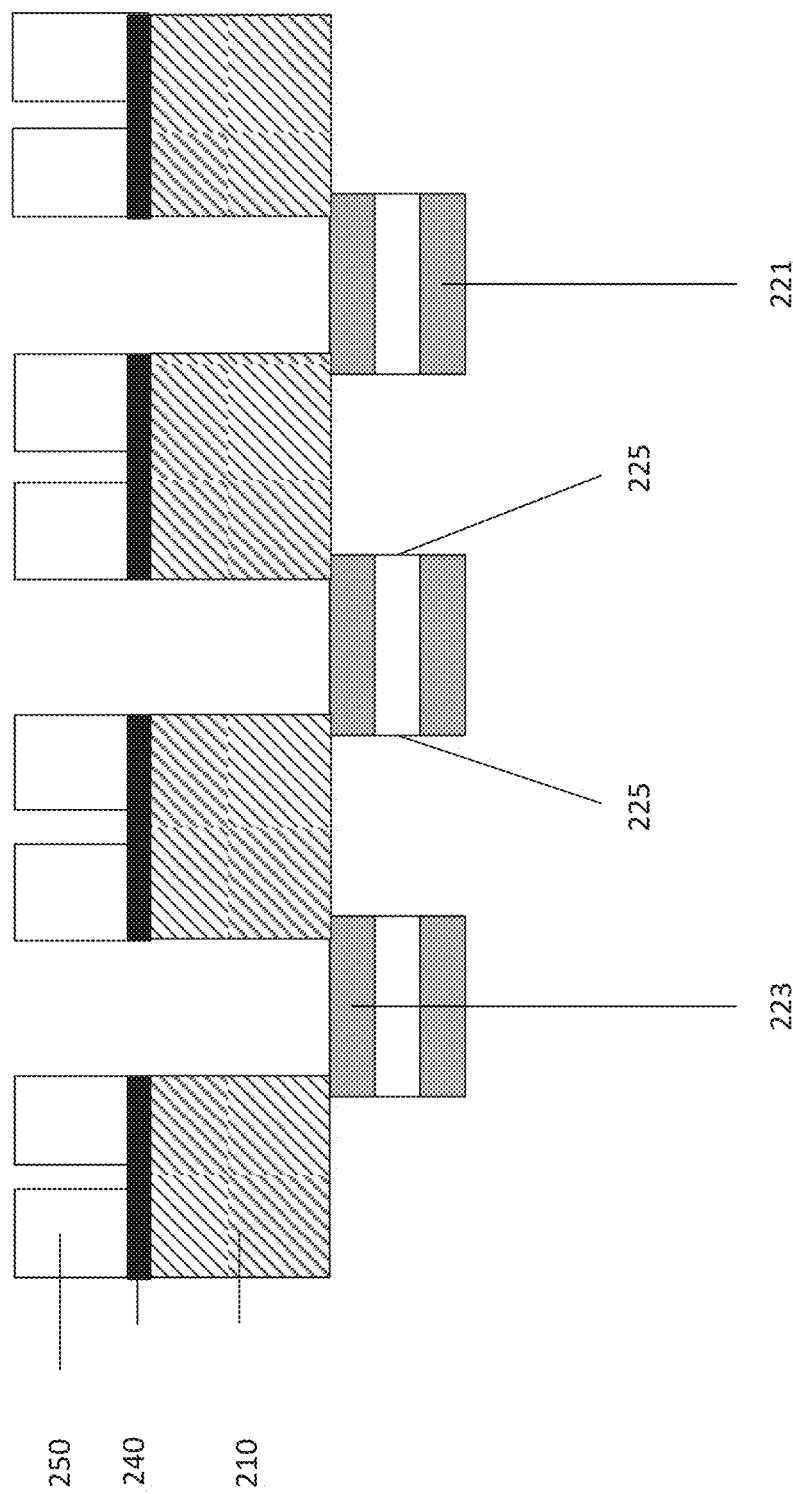

In the next step, shown in FIG. 2h, the sacrificial layer 222 is removed and the membrane 221 is released. The membrane 221 is released by a wet etching process. For example, the membrane 221 is released by a vapor or gas phase etching with HF based etches in case the sacrificial layer 222 is an oxide sacrificial layer. The sacrificial layer 222 is removed such that spacers 225 remain between the membrane 221 and the backplate 223. The spacers 223 provide the support for the membrane 221 and the backplate 223.

Figure 2I:
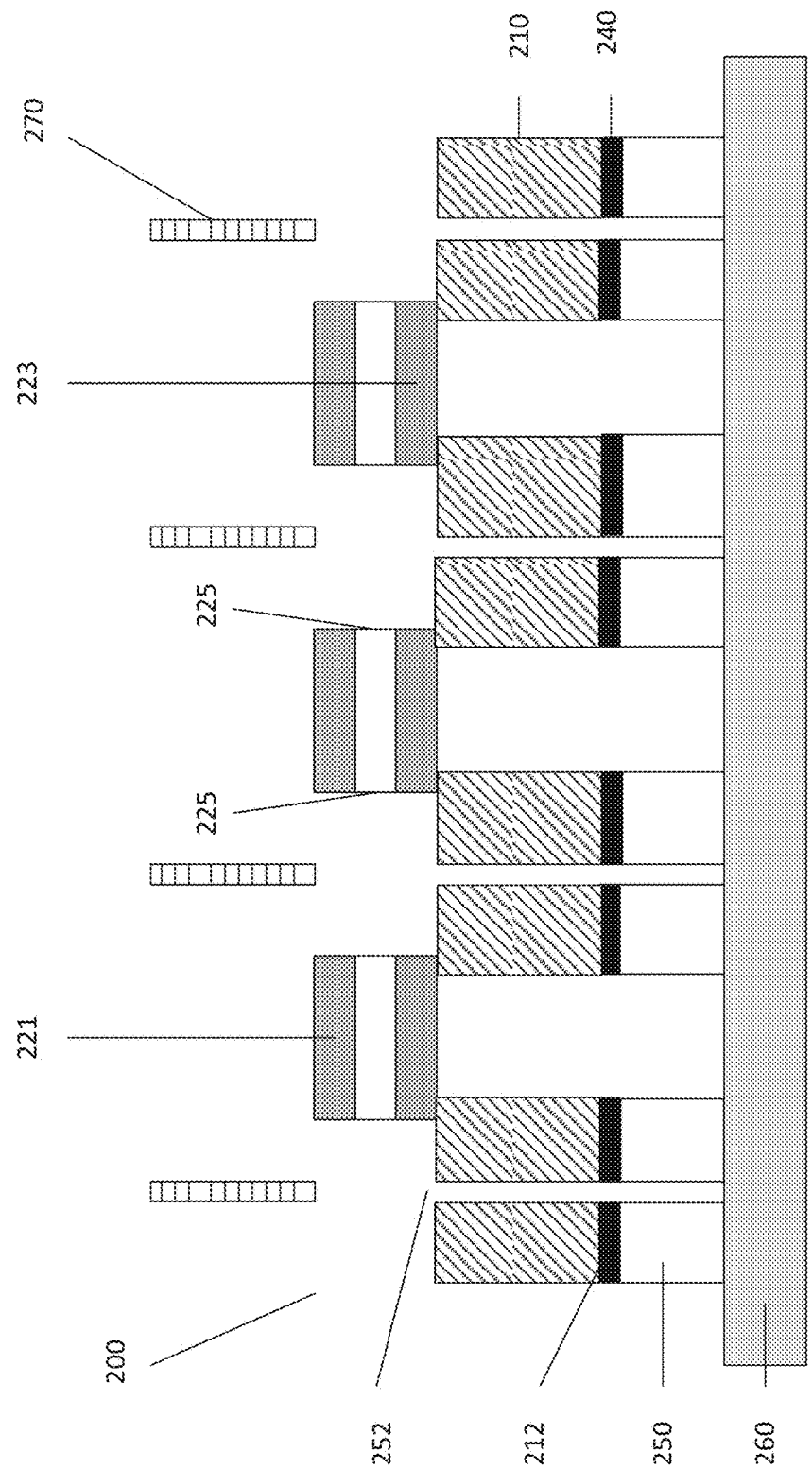

The wafer 200 is then flipped again and placed or put on a dicing support 260 such that the second main surface 212 faces the dicing support 260. The dicing support 260 may be a dicing foil. The substrate 210 is then cut with a cutting device 270 through the dicing slots 252 forming cutting lines in the substrate 210. In one embodiment the cutting device 270 is a laser. The laser 270 may melt the substrate 210 where it cuts through the substrate 210. The laser 270 may weaken the substrate 210 (but not separate it) or may cut and separate the substrate 210. Alternatively, the cutting device 270 is a wafer saw. The wafer saw 270 cuts and separates the substrate 210 in several pieces. This is shown in FIG. 2i.

Figure 2J:
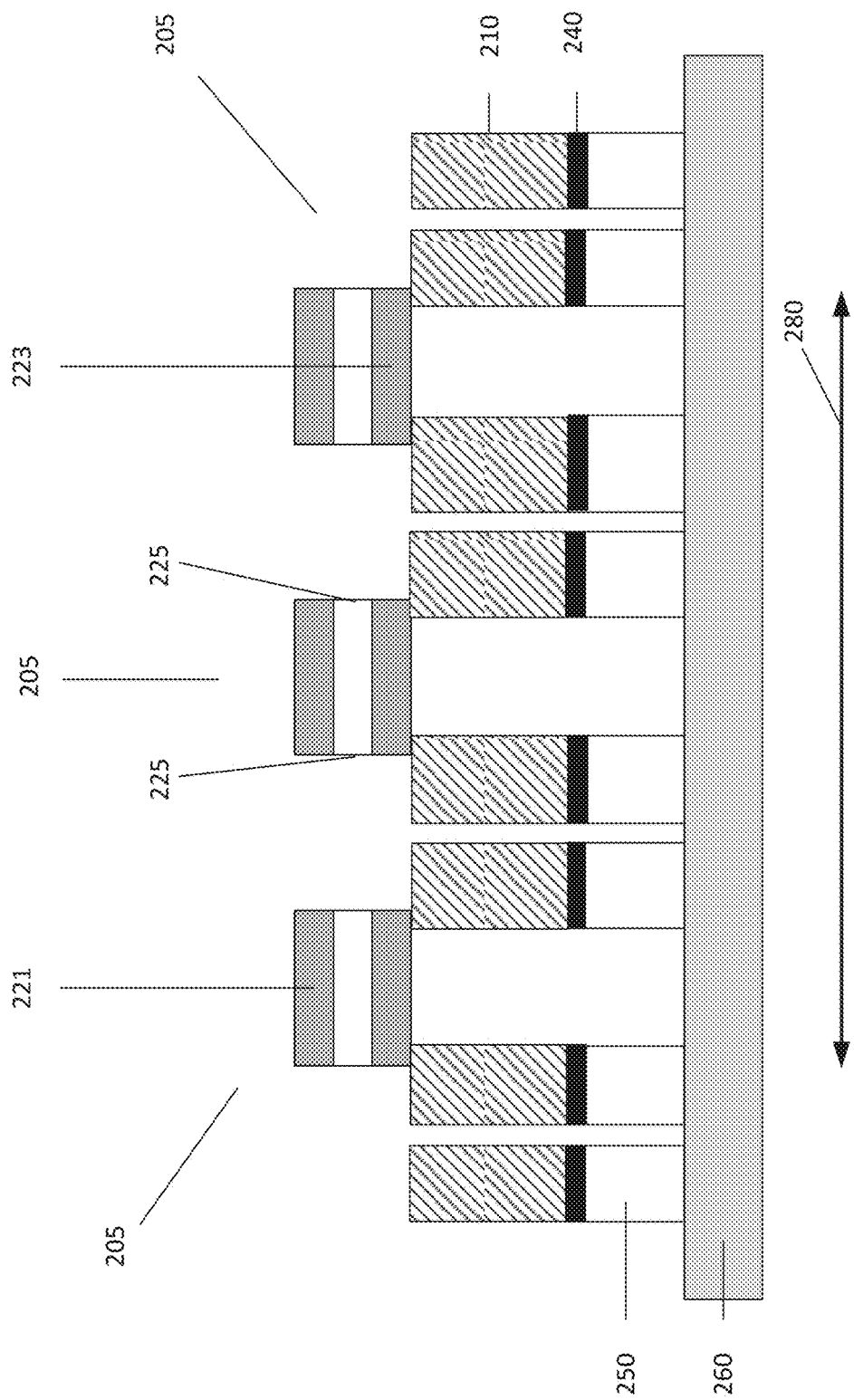

Finally, as shown in FIG. 2j, the dicing support 260 may be stretched in a horizontal direction 280 so that the individual MEMS devices 205 can be picked up. In one embodiment, the stretching 280 of the dicing support 260 may break and separate the individual MEMS devices 205 from each other. Moreover, the stretching 280 of the dicing support 260 may increase the space between the MEMS devices 205.

Figure 3A:
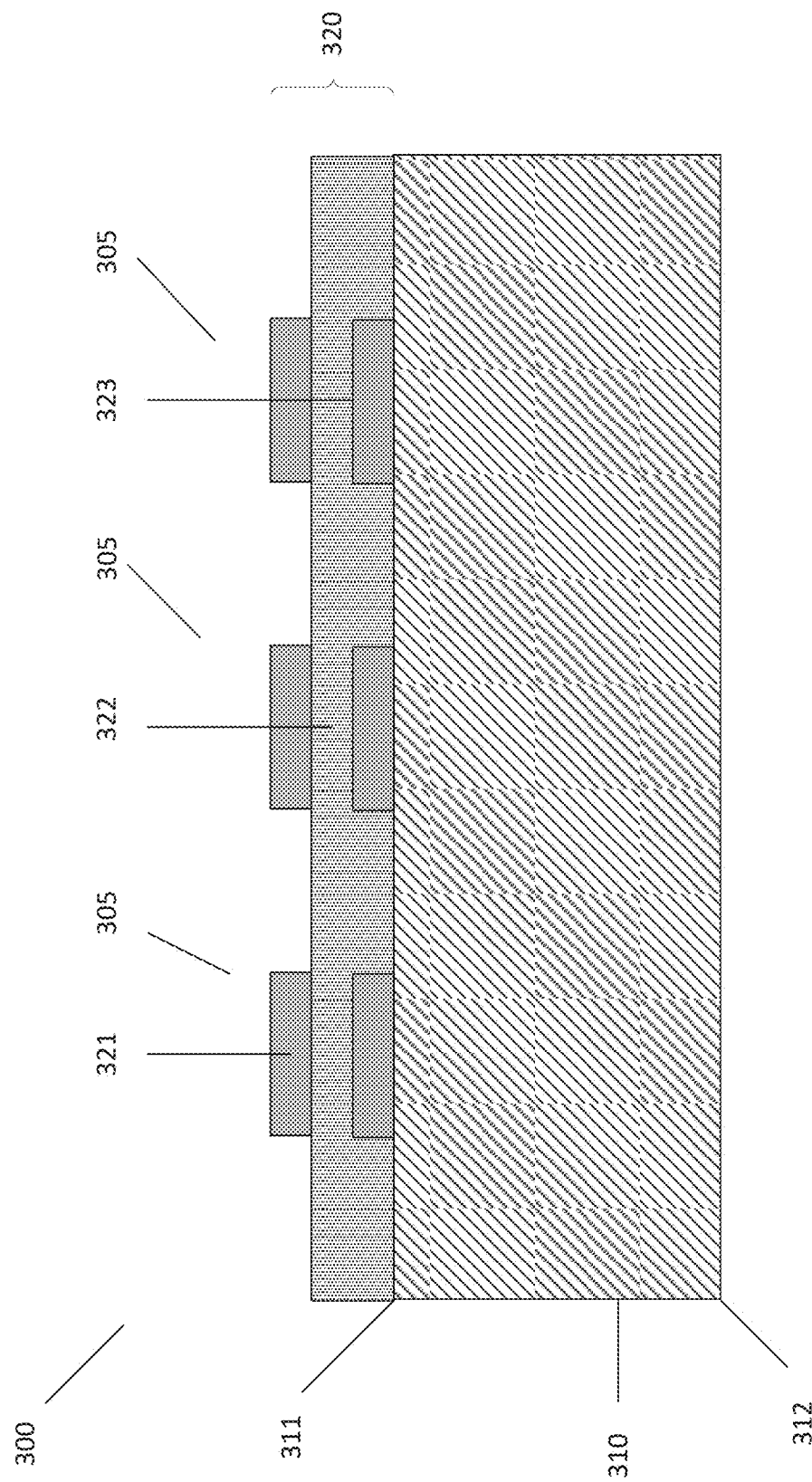
FIGS. 3a-3h show a yet another embodiment of a method to manufacture a MEMS device.

FIGS. 3a-3h illustrate an embodiment of a method to manufacture a MEMS device. FIG. 3a shows a MEMS wafer 300 comprising a substrate 310 with MEMS devices 305 disposed thereon. The substrate 310 comprises a first main surface or front side 311 and a second main surface or backside 312. The MEMS layer stacks 320 comprise a membrane 321 as a top layer of the MEMS layer stack 320, a backplate 323 and a sacrificial layer 322 between the membrane 321 and the backplate 323. Alternatively, the MEMS layer stack 320 comprise a backplate 323 as a top layer of the layer stack and the membrane 321 close to the substrate 310. The MEMS device 305 may be a MEMS microphone or a silicon microphone.

The sacrificial layer 322 may overly the entire substrate 310 or substantial portions outside the membrane 321/backplate 323. The sacrificial layer 322 may be about 0.5 µm to about 2 µm thick. Alternatively, the sacrificial layer 322 may be about 0.5 µm to about 1 µm thick.

In one embodiment the MEMS devices 305 may comprise transducers. The transducers may be sensors such as pressure sensors, accelerometers, or RF MEMS. The MEMS devices 305 may be stand-alone devices or alternatively may comprise additional devices. For example, the MEMS devices 305 may comprise integrated circuits (ICs) or preamplifiers and input/output terminals.

The substrate 310 may comprise a semiconductive material such as silicon or germanium, a compound semiconductor such as SiGe, GaAs, InP, GaN or SiC. Alternatively, the substrate 310 may comprise organic materials such as glass or ceramic. The MEMS wafer 300 may comprise a standard thickness of 400 µm to 500 µm. FIG. 3a may show the MEMS wafer 300 after the front side processing has been finished.

Figure 3B:
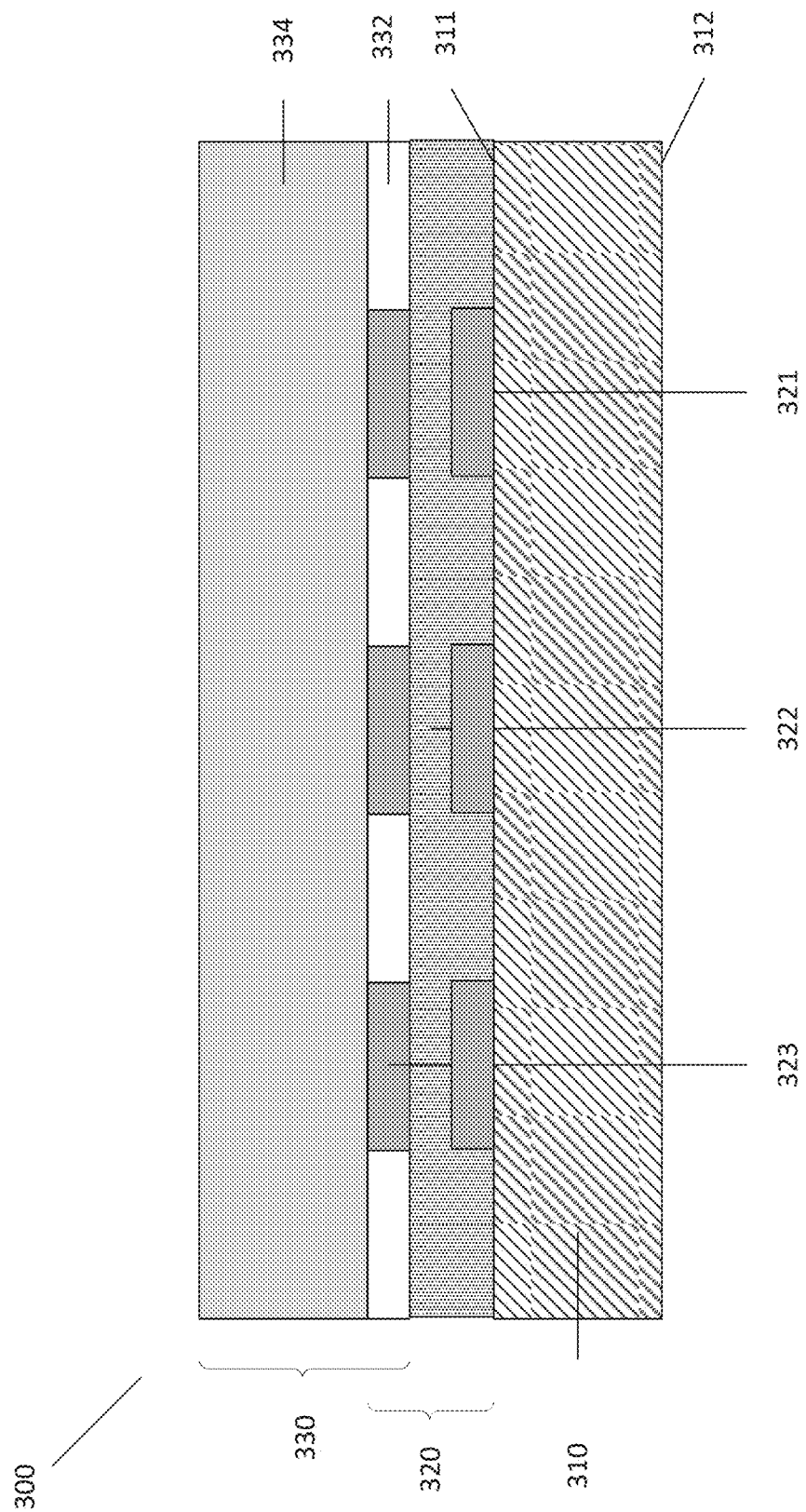

The MEMS wafer 300 is placed or mounted on a support carrier 330. The MEMS wafer 300 may be placed with its top surface 311 on the support carrier 330. The support carrier 330 may protect the MEMS layer stacks 320. The support carrier 330 may comprise a support substrate 334 and an adhesive layer 332. The adhesive layer 332 moves into and fills the gaps between the membranes 323 if there are any. The support carrier 334 may be glass or an UV tape and the adhesive layer 332 may be a wax or an otherwise adhesive material. As shown in FIG. 3b the substrate 310 of the MEMS wafer 300 is then thinned to a thickness of about 100 µm to about 200 µm or to a thickness of about 50 µm to about 200 µm. Thinning the substrate 310 may be an optional step. Thinning the substrate 310 may be carried out with an abrasive device or abrasive film from the backside 312.

Figure 3C:
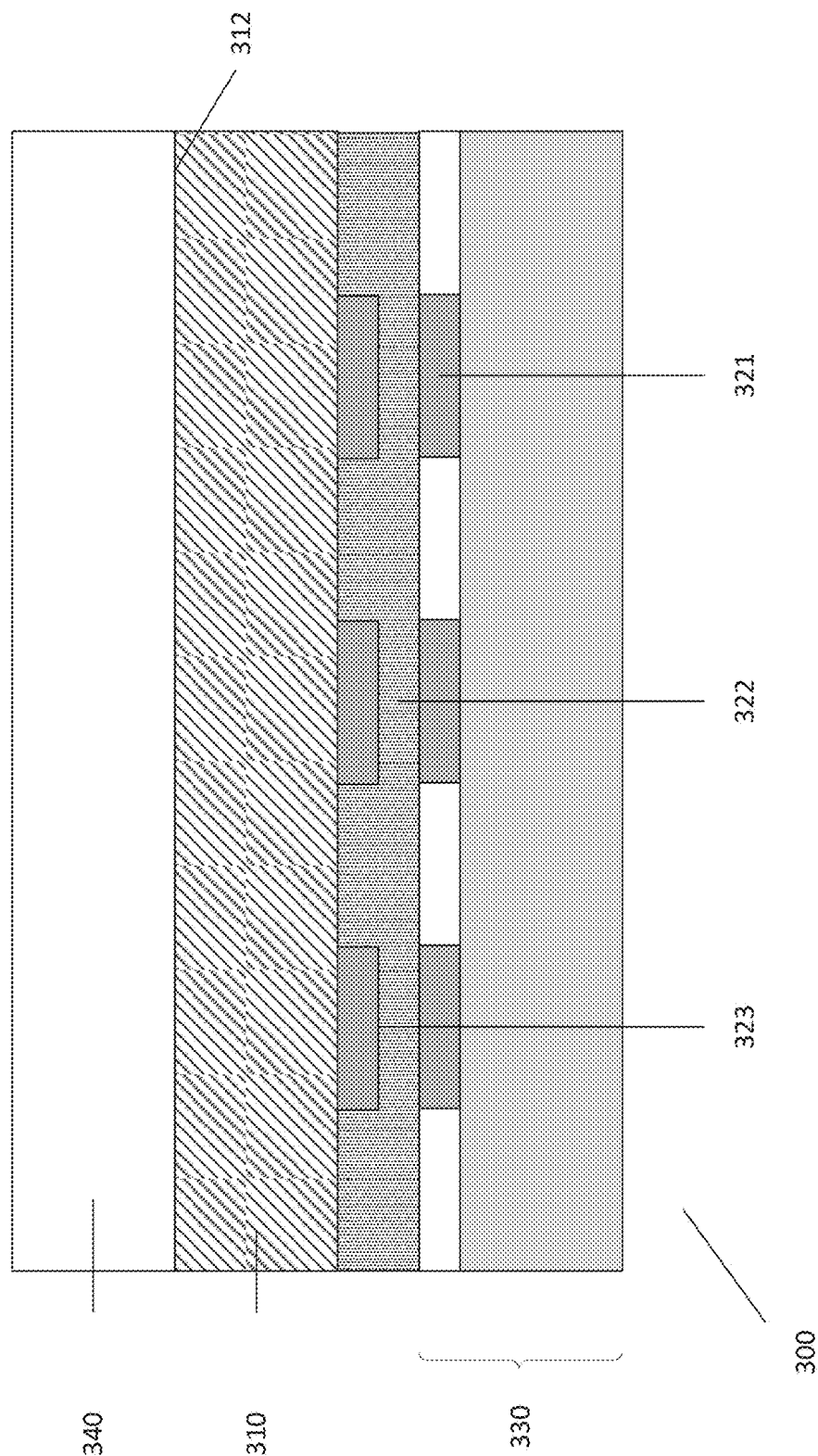

In a next step the MEMS wafer 300 is flipped and a polymer film 340 is disposed on the second main surface 312 of the substrate 310. The polymer film 340 may be a photo structurable polymer film. In one embodiment the polymer film 340 may be an epoxy based negative photoresist. For example, the polymer film 340 may be SU-8 resist. The SU-8 resist comprises a chemically amplified, epoxy based negative resist that is optically transparent and photo imagable to near UV (365 nm) radiation. Cured SU-8 resist films or microstructures are very resistant to solvents, acids and bases and have excellent thermal and mechanical stability. Alternatively, the polymer film 340 may be an epoxy based positive photoresist. The polymer film 340 may be deposited or spun on the backside 312 of the substrate 310. The polymer film 340 may comprise a thickness of about 100 µm to about 200 µm or to a thickness of about 50 µm to about 300 m. This is shown in FIG. 3c.

Figure 3D:
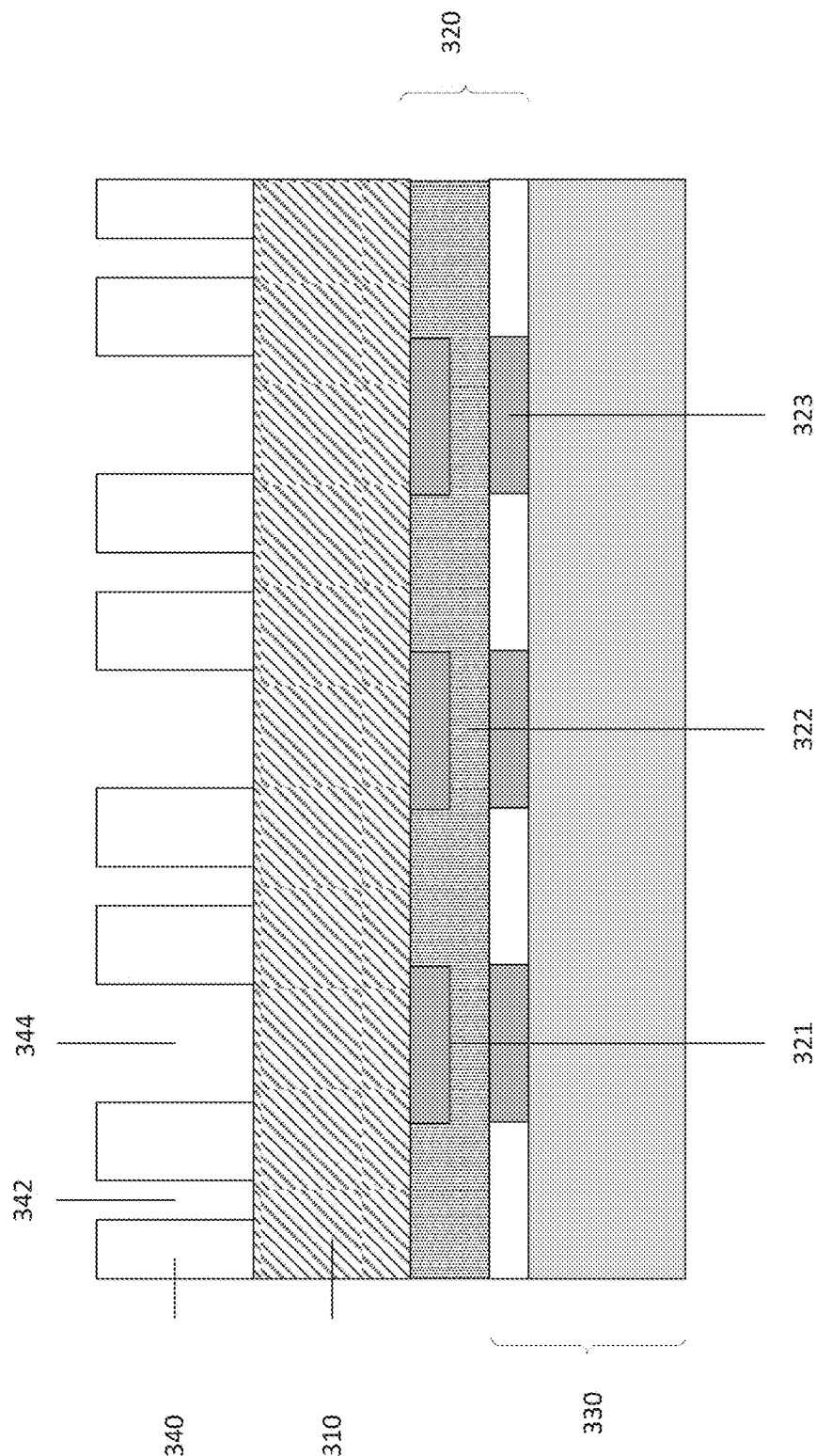

As shown in FIG. 3d, the polymer film 340 is then structured and openings 342, 344 are formed. The openings 342 are the pattern for cutting lines in the substrate 310 and the openings 344 are the pattern for openings the MEMS stack 320 opening. The MEMS stack opening may be a back-cavity or a sound port of the MEMS device 305.

Figure 3E:
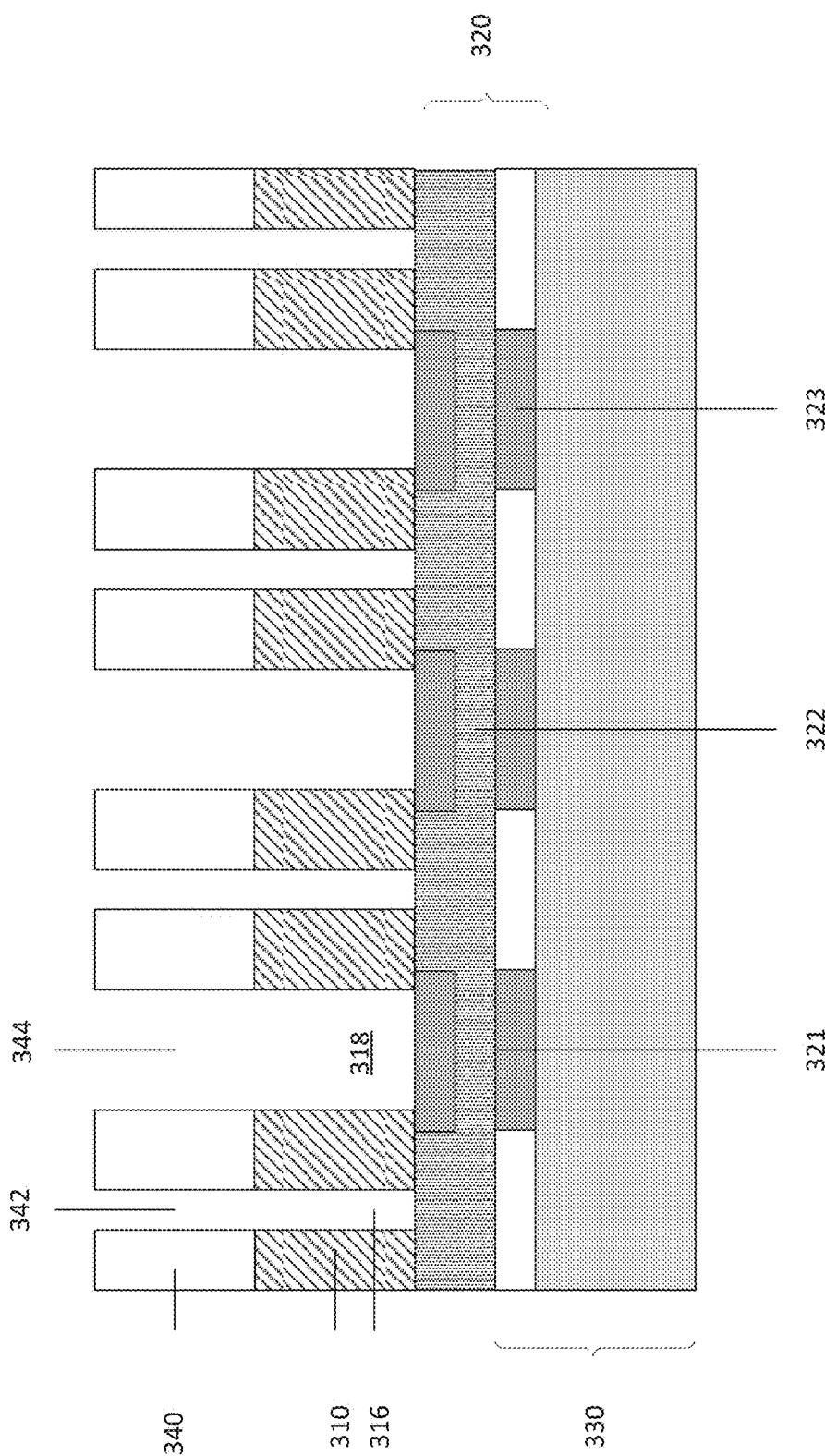

Then the substrate 310 is etched. The substrate 310 may be etched applying a directional or anisotropic etch. The substrate 310 may be etched with a dry etch or a wet etch. For example, the substrate 310 may be etched with a deep RIE. Openings 316 and 318 are formed in the substrate 310. This is shown in FIG. 3e.

Figure 3F:
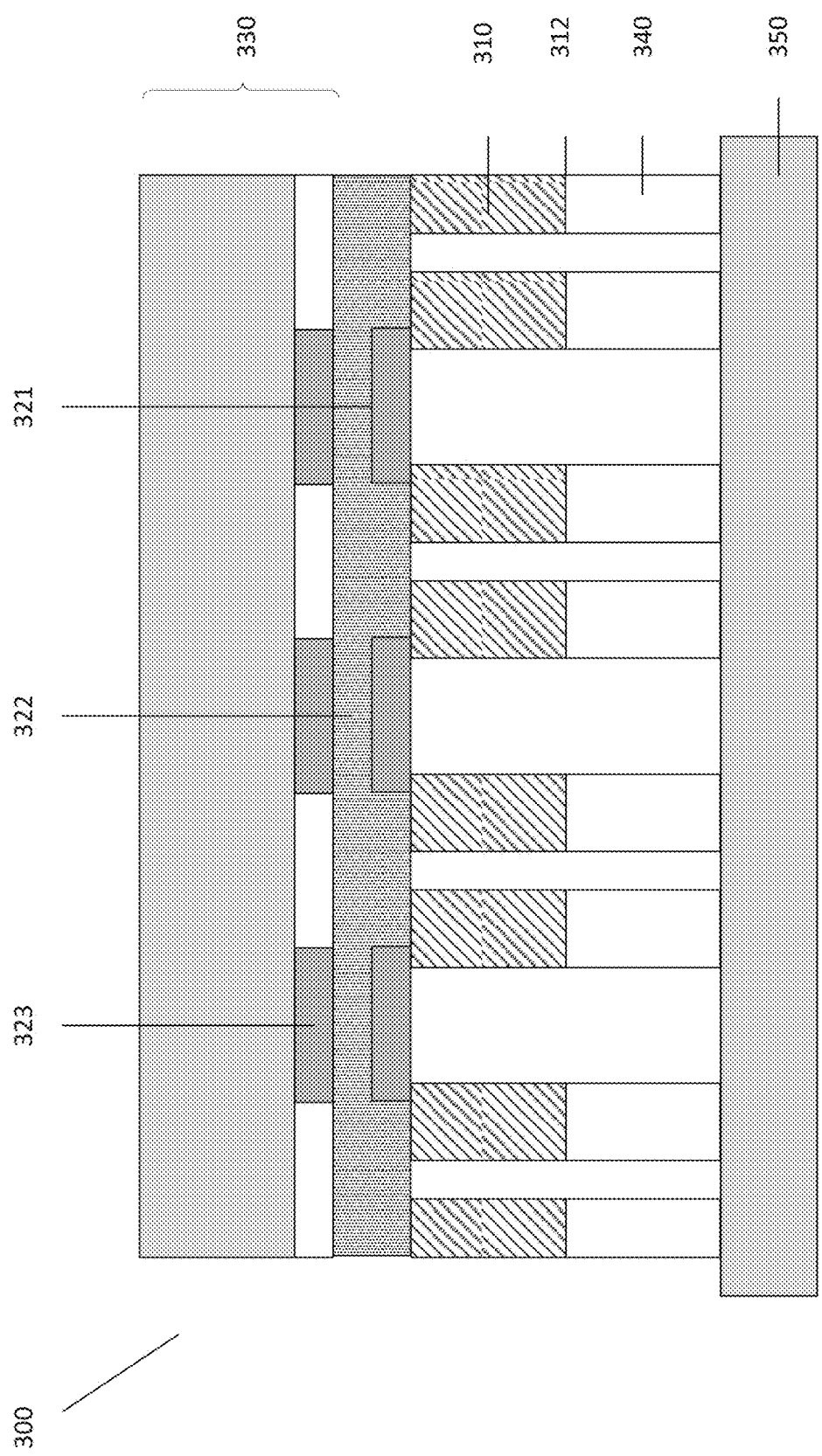

In the step shown in FIG. 3f, the MEMS wafer 300 is then flipped again and placed or put on a dicing foil 350 such that the second main surface 312 faces the dicing foil 350. The dicing foil 350 may be any type of support structure. For example, the dicing foil 350 may be a glass wafer with an UV tape.

Figure 3G:
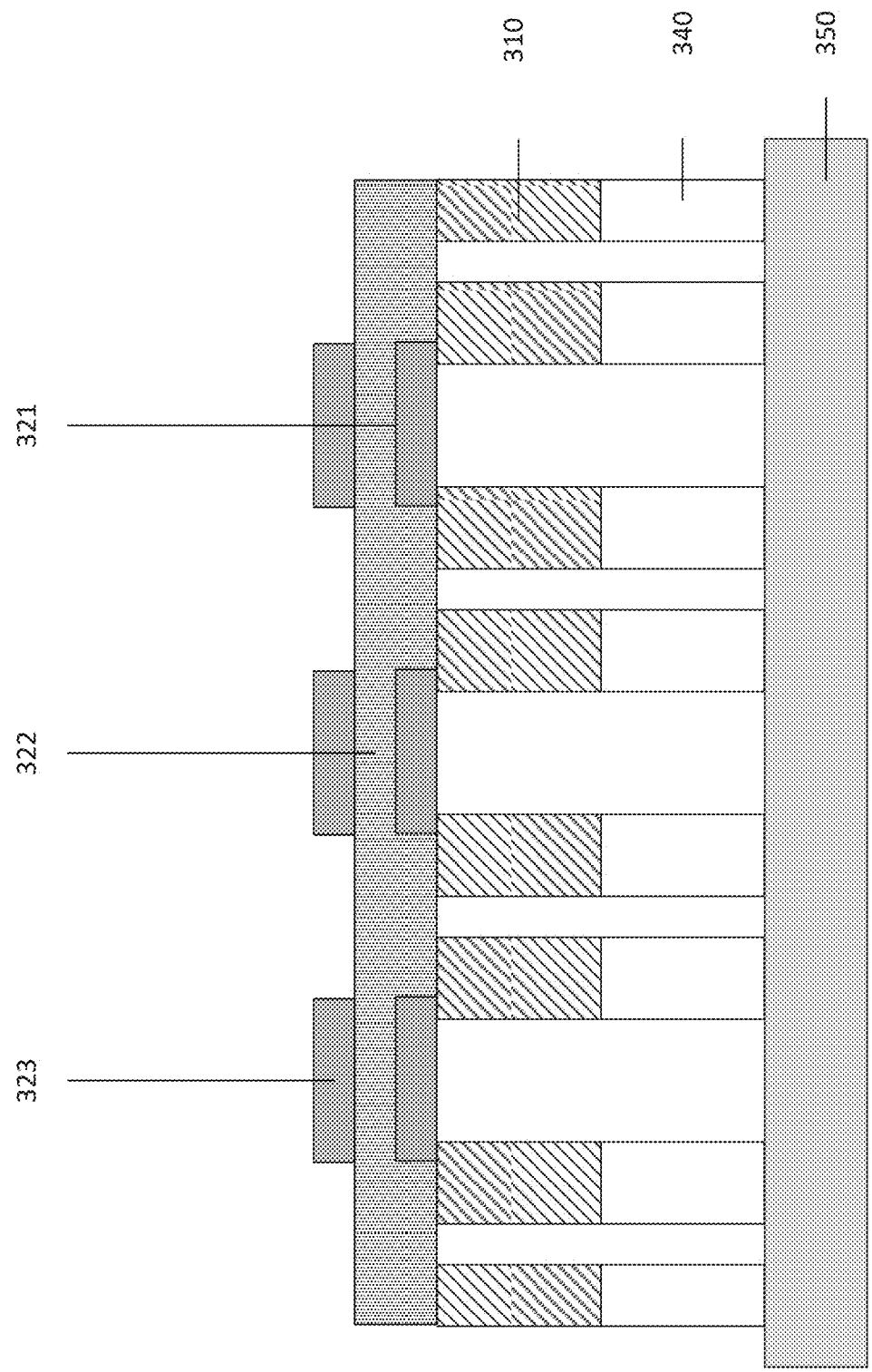

The support carrier 330 (e.g., the substrate 334 and the adhesive layer 332) is removed from the substrate 310. The support carrier 330 is removed by pulling or detaching the support carrier 330 from the substrate 310. The resulting structure is shown in FIG. 3g.

Figure 3H:
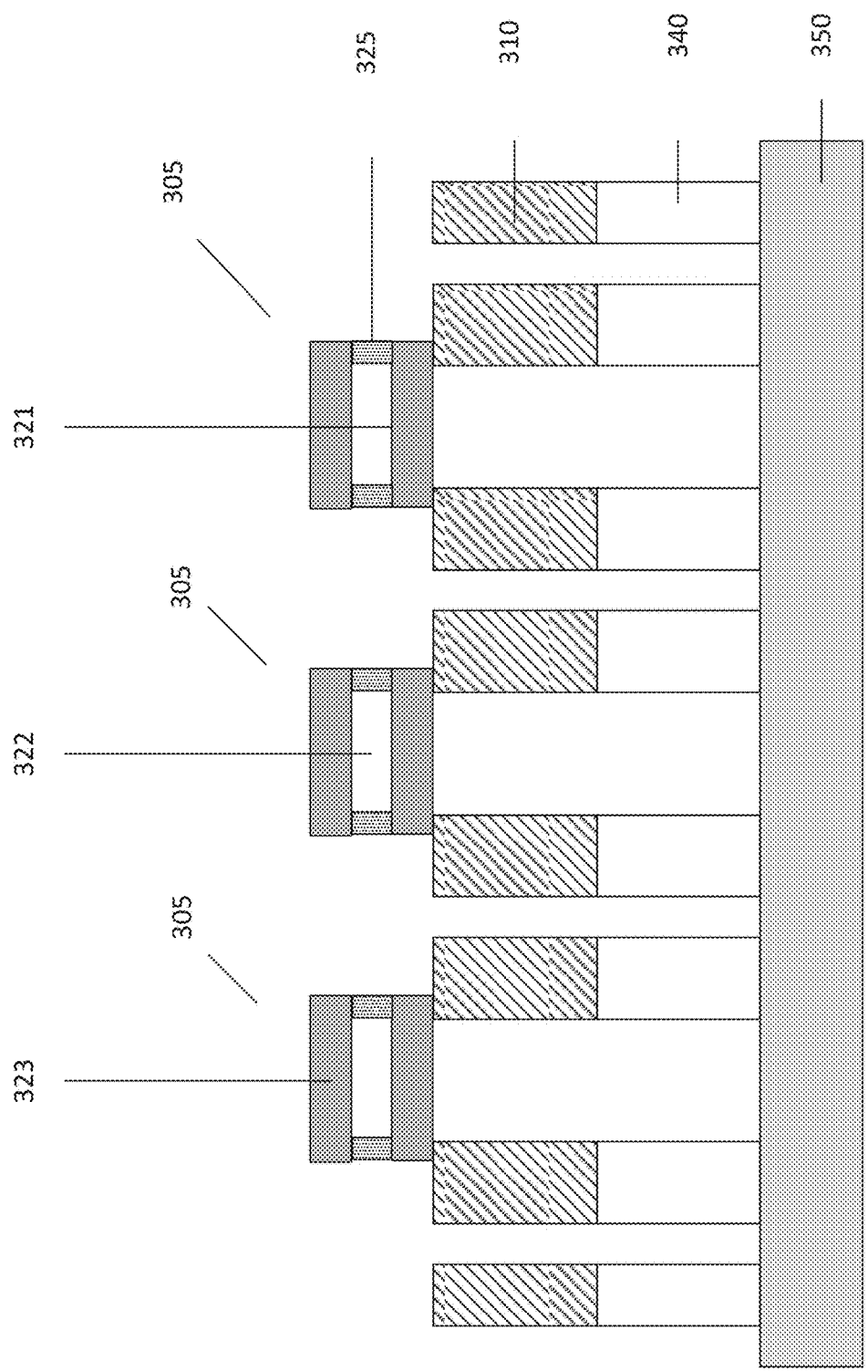

In the next step, shown in FIG. 3h, the sacrificial layer 322 is removed and the membrane 321 is released. The sacrificial layer 322 is removed such that spacers 325 remain between the membrane 321 and the backplate 323. The spacers 325 provide the support for the membrane 321 and the backplate 323. In one embodiment the sacrificial layer is removed by vapor or gas phase etching. For example, HF is used for silicon oxide etching.

In one embodiment the entire sacrificial layer 322 is removed. The membrane 321 is released at the same time as the MEMS devices 305 are separated. The individual MEMS devices 305 are now ready for pick-up.

FIGS. 4a-4c show an embodiment of a MEMS device 400. FIG. 4a shows a cross-sectional view of the MEMS device 400, FIG. 4b shows a top view of the MEMS device 400 and FIG. 4c shows a bottom view of the MEMS device 400. The MEMS device 400 may comprise the MEMS devices manufactured and described with respect to previous embodiments.

The MEMS device 400 shows a substrate 410 disposed on the hard mask layer 440. The hard mask layer 440 is disposed on the polymer layer 450. A MEMS stack 420 is disposed on the substrate 410. The MEMS stack 420 may comprise a top backplate 421, spacers 425 and a bottom membrane 423. The backplate 421 comprises perforation holes 428. The opening 460 in the mask layer 440, the polymer layer 450 and the substrate 410 may be a sound port.

In an alternative embodiment the MEMS stack 420 comprises a top membrane 421, spacers 425 and a bottom backplate 423. The bottom backplate 423 comprises venti-lation holes. The opening 460 in the mask layer 440, the polymer layer 450 and the substrate 410 may be a back volume.

The opening 460 may comprise the same diameter in the substrate 410, the mask layer 440 and the polymer layer 450. The opening 460 may be a circle or oval. Alternatively, the opening 460 may comprise other suitable geometry such as a square or a rectangle.

FIGS. 5a-5c show an embodiment of a MEMS device 500. FIG. 5a shows a cross-sectional view of the MEMS device 500, FIG. 5b shows a top view of the MEMS device 500 and FIG. 5c shows a bottom view of the MEMS device 500. The MEMS device 500 may comprise the MEMS devices manufactured or described with respect to previous embodiments.

The MEMS device 500 shows a substrate 510 disposed on the hard mask layer 540. The hard mask layer 540 is disposed on the polymer layer 550. A MEMS stack 520 is disposed on the substrate 510. The MEMS stack 520 comprises a top backplate 521, spacers 525 and a bottom membrane 523. The backplate 521 comprises perforation holes 528. The opening 560 in the polymer layer 550 is larger than the opening in the substrate 510. The opening 560/565 may be a sound port or back-cavity.

In an alternative embodiment the MEMS stack 520 comprises a top membrane 521, spacers 525 and a bottom backplate 523. The bottom backplate 523 comprises perforation holes. The opening 560 in the mask layer 540, the polymer layer 550 and the substrate 510 may be a back volume. The opening 560 may comprise a different diameter in the substrate 510 than in the polymer layer 550. The openings 560/565 may be circles or ovals. Alternatively, the openings 560/565 may comprise other suitable geometries such as squares or rectangles.

FIGS. 6a-6c show MEMS device 600 embodiments of the invention. FIG. 6a shows a cross-sectional view of the MEMS device 600, FIG. 6b shows a top view of the MEMS device 600 and FIG. 6c shows a bottom view of the MEMS device 600. The MEMS device 600 may comprise the MEMS devices described with respect to previous embodiments.

The MEMS device 600 shows a substrate 610 disposed on the hard mask layer 640. The hard mask layer 640 is disposed on the polymer layer 650. The polymer layer 650 may comprise openings or trenches 653. A MEMS stack 620 is disposed on the substrate 610. The MEMS stack 620 comprises a top backplate 621, spacers 625 and a bottom membrane 623. The backplate 621 comprises perforation holes 628. The opening 660 in the mask layer 640, the polymer layer 650 and the substrate 610 may be a sound port.

In an alternative embodiment the MEMS stack 620 comprises a top membrane 621, spacers 625 and a bottom backplate 623. The bottom backplate 623 comprises perforation holes. The opening 660 in the mask layer 640, the polymer layer 650 and the substrate 610 may be a back volume. The opening 660 may comprise the same diameter in the substrate 610, the mask layer 640 and the polymer layer 650. The opening 660 may be a circle or oval. Alternatively, the opening 660 may comprise other suitable geometry such as a square or a rectangle. The polymer layer 650 may comprise circular rings or oval rings 653, 655. Alternatively, the polymer layer 650 may comprise other suitable geometric rings 653, 655 such as a square rings or a rectangle rings.

The embodiments of FIGS. 5a-5c can be combined with the embodiment of FIGS. 6a-6c.

Figure 6D:
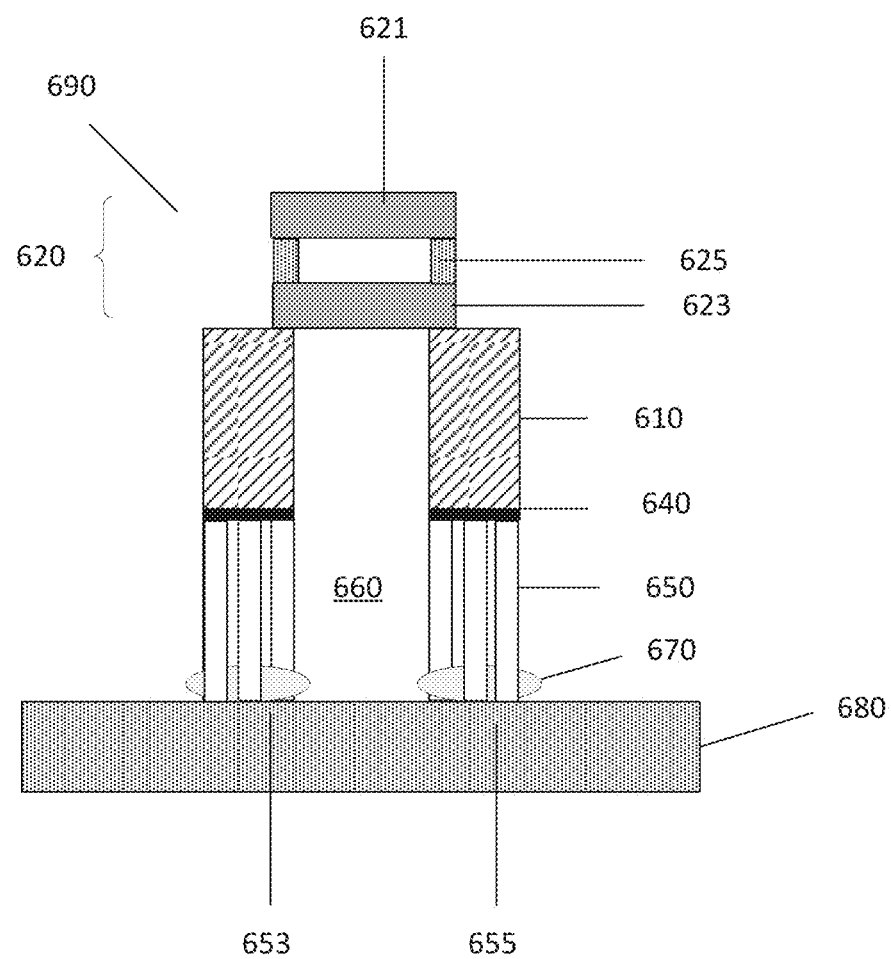

FIG. 6d shows a MEMS system, a MEMS module or an assembled MEMS system 690. The MEMS module 690 comprises the MEMS device 600 attached to a MEMS device carrier 680. The MEMS device carrier 680 may be a substrate, a laminate, a ceramic or a printed circuit board (PCB). The MEMS device 600 is attached to the MEMS device carrier 680 by an adhesive 670 such as a glue, an adhesive foil or a combination thereof. An advantage of the MEMS module 690 is that stress is highly decoupled.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing microelectromechanical systems (MEMS) devices, the method comprising:
   forming a MEMS stack over a first main surface of a substrate;
   forming a polymer layer over a second main surface of the substrate;
   forming a first opening in the polymer layer such that the first opening overlaps with the MEMS stack;
   forming a second opening in the polymer layer while forming the first opening in the polymer layer;
   filling the second opening with an etch stop material to cover the polymer layer; and
   with the etch stop material covering the polymer layer, etching the substrate to extend the first opening into the substrate such that the first opening exposes a surface of the MEMS stack.

2. The method according to claim 1, further comprising performing a release etch to form moveable components of the MEMS devices.

3. The method according to claim 2, performing the release etch comprising etching with HF based chemistry.

4. The method according to claim 2, wherein the MEMS stack comprises a sacrificial layer disposed between a backplate and a membrane, and wherein the release etch removes all of the sacrificial layer.

5. The method according to claim 2, wherein the MEMS stack comprises a sacrificial layer disposed between a backplate and a membrane, and wherein the release etch removes a substantial portion of the sacrificial layer leaving spacers.

6. The method according to claim 1, wherein the polymer layer is a negative photoresist.

7. The method according to claim 1, wherein the polymer layer is a positive photoresist.

8. The method according to claim 1, further comprising cutting the substrate to form individual MEMS devices without removing the polymer layer.

9. The method according to claim 8, wherein the cutting is aligned with the second opening.

10. The method according to claim 8, wherein the etch stop material comprises a hard mask.

11. A method for manufacturing microelectromechanical systems (MEMS) devices, the method comprising:
    forming a MEMS stack over a first main surface of a substrate;
    thinning the substrate to expose a second main surface;
    forming a polymer layer over the second main surface;
    patterning the polymer layer to form a first opening and a second opening, wherein the first opening overlaps with the MEMS stack;
    filling the second opening with a masking layer to cover the polymer layer;
    with the masking layer covering the polymer layer, extending the first opening into the substrate such that the first opening exposes a surface of the MEMS stack;
    removing the masking layer after exposing the surface of the MEMS stack; and
    performing a release etch to form moveable components of the MEMS devices.

12. The method according to claim 11, wherein performing the release etch comprising etching with HF based chemistry.

13. The method according to claim 11, wherein the MEMS stack comprises a sacrificial layer disposed between a backplate and a membrane, and wherein the release etch removes all of the sacrificial layer.

14. A method, for manufacturing microelectromechanical systems (MEMS) devices, the method comprising:
    forming a MEMS stack over a first main surface of a substrate;
    thinning the substrate to expose a second main surface;
    forming a polymer layer over the second main surface;
    patterning the polymer layer to form a first opening and a second opening, wherein the first opening overlaps with the MEMS stack;
    filling the second opening with a masking layer to cover the polymer layer;
    with the masking layer covering the polymer layer, extending the first opening into the substrate such that the first opening exposes a surface of the MEMS stack;
    removing the masking layer after exposing the surface of the MEMS stack; and
    Performing a release etch to form moveable components of the MEMS devices, wherein the MEMS stack comprises a sacrificial layer disposed between a backplate and a membrane, and wherein the release etch removes a substantial portion of the sacrificial layer leaving spacers.

15. The method according to claim 14, wherein performing the release etch comprising etching with HF based chemistry.

16. The method according to claim 14, wherein the polymer layer is a negative photoresist.

17. The method according to claim 14, wherein the polymer layer is a positive photoresist.

* * * * *